United States Patent
Chen

(10) Patent No.: US 11,418,113 B2
(45) Date of Patent: Aug. 16, 2022

(54) INDUCTOR CURRENT EMULATOR CIRCUIT AND INDUCTOR CURRENT EMULATION METHOD

(71) Applicant: RICHTEK TECHNOLOGY CORPORATION, Zhubei (TW)

(72) Inventor: Hsuan-Ju Chen, Kaohsiung (TW)

(73) Assignee: RICHTEK TECHNOLOGY CORPORATION, Hsinchu (TW)

( * ) Notice: Subject to any disclaimer, the term of this patent is extended or adjusted under 35 U.S.C. 154(b) by 294 days.

(21) Appl. No.: 16/924,981

(22) Filed: Jul. 9, 2020

(65) Prior Publication Data

US 2021/0099080 A1  Apr. 1, 2021

Related U.S. Application Data

(60) Provisional application No. 62/907,613, filed on Sep. 28, 2019.

(30) Foreign Application Priority Data

Feb. 18, 2020 (TW) ................... 109105228

(51) Int. Cl.
  *H02M 3/155* (2006.01)
  *H03K 4/00* (2006.01)
  *H03F 3/45* (2006.01)

(52) U.S. Cl.
  CPC ........ *H02M 3/155* (2013.01); *H03F 3/45475* (2013.01); *H03K 4/00* (2013.01)

(58) Field of Classification Search
  CPC ....... H02M 3/155; H03F 3/45475; H03K 4/00
  USPC .......................................................... 330/252
  See application file for complete search history.

(56) References Cited

U.S. PATENT DOCUMENTS

| | | | |
|---|---|---|---|
| 9,065,337 B2 | 6/2015 | Tanabe et al. | |
| 9,184,651 B2 * | 11/2015 | Nguyen | G01R 19/0092 |
| 9,780,662 B1 | 10/2017 | Milanesi | |
| 9,966,855 B2 | 5/2018 | Ragona et al. | |
| 10,044,267 B1 | 8/2018 | Childs | |
| 10,128,753 B2 * | 11/2018 | Hartman | H02M 3/156 |
| 2014/0239925 A1 * | 8/2014 | Tanabe | H02M 3/158 |
| | | | 323/271 |

* cited by examiner

*Primary Examiner* — Tomi Skibinski
(74) *Attorney, Agent, or Firm* — Tung & Associates

(57) ABSTRACT

An inductor current emulator circuit includes a ramp signal generation circuit and an emulator control circuit. The inductor emulator circuit generates a ramp signal for emulating an inductor current flowing through an inductor of a power stage circuit. The ramp signal generation circuit generates the ramp signal according to a first signal and a second signal. A current sense signal is related a high side switch current flowing through the high side switch or a low side switch current flowing through the low side switch. The emulator control circuit obtains a first difference integration value and a second difference integration value of differences between the current sense signal and the ramp signal during a first duration and a second duration, respectively, to generate the first signal and the second signal, respectively. Center time points of the first duration and the second duration are different from each other.

30 Claims, 13 Drawing Sheets

INDUCTOR CURRENT EMULATOR CIRCUIT AND INDUCTOR CURRENT EMULATION METHOD

CROSS REFERENCE

The present invention claims priority to U.S. 62/907,613 filed on Sep. 28, 2019 and claims priority to TW 109105228 filed on Feb. 18, 2020.

BACKGROUND OF THE INVENTION

Field of Invention

The present invention relates to an inductor current emulator circuit; particularly, it relates to such inductor current emulator circuit for use in a switching regulator. The present invention also relates to an inductor current emulation method for use in a switching regulator.

Description of Related Art

Please refer to FIG. 1, which shows a schematic diagram of a conventional switching regulator (i.e., switching regulator 100) having an inductor current emulator circuit. The switching regulator 100 is configured to operably convert an input voltage Vin to an output voltage Vout. The switching regulator 100 comprises a power stage circuit 110 and a control circuit 120. The control circuit 120 is configured to operably generate an operation signal for controlling a high side switch UG and a low side switch LG of the power stage circuit 110, so as to convert the input voltage Vin to the output voltage Vout. As shown in FIG. 1, the power stage circuit 110 includes a buck power stage circuit. The buck power stage circuit comprises: a high side switch UG, a low side switch LG and an inductor L. Operation details of a buck power stage circuit are well known to those skilled in the art, so the details thereof are not redundantly explained here.

In the prior art shown in FIG. 1, the power stage circuit 110 further includes an inductor current emulator circuit 111. The inductor current emulator circuit 111 comprises: the above-mentioned inductor L which has an equivalent resistance DCR, a sensing resistor Rx and a sensing capacitor Cx. The sensing resistor Rx is connected in series to the sensing capacitor Cx, and the inductor L is connected in parallel to the series circuit formed by the sensing resistor Rx and the sensing capacitor Cx. By properly selecting the resistance of the sensing resistor Rx and the capacitance of the sensing capacitor Cx, a desired Pole-Zero cancellation can be achieved during operation of the inductor current emulator circuit 111. Under such circumstance, regardless whether the inductor current IL flowing through the inductor L is a DC current or an AC current, because the voltage drop Vcx across the sensing capacitor Cx is proportional to the inductor current IL, the inductor current emulator circuit 111 can emulate the inductor current IL according to the voltage drop Vcx across the sensing capacitor Cx. The computation formulas regarding the above-mentioned relationships are well known to those skilled in the art, so the details thereof are not redundantly explained here.

The prior art shown in FIG. 1 has following drawbacks that: first, because it is required for the resistance of the sensing resistor Rx and the capacitance of the sensing capacitor Cx to be designed in correspondence to the inductance of the inductor L and the resistance DCR, in order to match for different inductors L having different inductances, the RC circuit formed by the sensing resistor Rx and the sensing capacitor Cx cannot be integrated into an integrated circuit including the control circuit 120. Second, because the equivalent resistance DCR is easily affected by temperature variations, it is required for the inductor current emulator circuit 111 of the prior art to take temperature compensation into consideration in its design, so the design of the inductor current emulator circuit 111 of the prior art is complicated.

The following prior arts are relevant to the present invention: U.S. Pat. No. 9,065,337B2, U.S. Pat. No. 9,184,651B2, U.S. Pat. No. 9,966,855B2, U.S. Pat. No. 10,044,267B1 and U.S. Pat. No. 10,128,753B2.

The above-mentioned prior arts relevant to the present invention have following drawbacks that: first, an extra sample and hold circuit is required, so the inductor current emulator circuit will occupy a large space and the manufacturing cost is high. Second, the inductor current emulator circuit of the above-mentioned prior arts requires a complicated design, thus further increasing the manufacturing cost.

In view of the above, to overcome the drawbacks in the prior arts, the present invention proposes an inductor current emulator circuit and an inductor current emulation method for use in a switching regulator. In the present invention, because it is not required for the inductor L to be connected in parallel with an RC circuit, the inductor current emulator circuit of the present invention can be integrated into an integrated circuit, resulting merits of: low temperature effect, high accuracy, and low manufacturing cost.

SUMMARY OF THE INVENTION

From one perspective, the present invention provides an inductor current emulator circuit for use in a switching regulator, the switching regulator being configured to operably control a high side switch and/or a low side switch of a power stage circuit of the switching regulator, so as to convert an input voltage to an output voltage, wherein the inductor current emulator circuit is configured to operably generate a ramp signal for emulating an inductor current flowing through an inductor of the power stage circuit; the inductor current emulator circuit comprising: a ramp signal generation circuit, which is configured to operably generate the ramp signal according to a first signal and a second signal; and an emulator control circuit coupled to the power stage circuit and the ramp signal generation circuit, wherein the emulator control circuit is configured to operably generate the first signal and the second signal according to a current sense signal and the ramp signal; wherein the current sense signal is related to a high side switch current flowing through the high side switch or a low side switch current flowing through the low side switch; wherein the emulator control circuit obtains a first difference integration value of differences between the current sense signal and the ramp signal during a first duration, to generate the first signal; wherein the emulator control circuit obtains a second difference integration value of differences between the current sense signal and the ramp signal during a second duration, to generate the second signal; wherein a center time point of the first duration is different from a center time point of the second duration.

In one embodiment, the first duration and the second duration are two different durations after a settle time from when one of the high side switch and the low side switch is in ON operation.

In one embodiment, the first signal and the second signal are configured to operably determine at least two of the group consisting of a rising slope, a falling slope, a peak, a valley and a peak-to-valley value of the ramp signal.

In one embodiment, a value of the ramp signal is regulated to a value of the inductor current multiplied by a predetermined real number, and further plus a predetermined compensation value.

In one embodiment, the value of the ramp signal is not smaller than zero.

In one embodiment, the emulator control circuit is configured to operably generate the first signal and the second signal to control the ramp signal generation circuit, thereby regulating both of the first difference integration value and the second difference integration value to zero.

In one embodiment, the emulator control circuit includes an amplifier circuit, which is configured to operably compare the current sense signal with the ramp signal, to generate the differences between the current sense signal and the ramp signal.

In one embodiment, the emulator control circuit further includes a feedforward circuit, which is coupled between two input terminals of the amplifier circuit, wherein the feedforward circuit is configured to operably feedforward the current sense signal and the ramp signal, so as to expedite regulation of the ramp signal.

In one embodiment, the emulator control circuit includes: an operational trans-impedance amplifier (OTA), wherein the same single OTA is configured to operably compare the current sense signal with the ramp signal during the first duration and the second duration, and respectively generate a corresponding first current during the first duration and a corresponding second current during the second duration according to the differences between the current sense signal and the ramp signal; a first capacitor configured to be operably charged by the first current to generate the first signal; and a second capacitor configured to be operably charged by the second current to generate the second signal.

In one embodiment, the emulator control circuit includes: a first operational trans-impedance amplifier (OTA), wherein the first OTA is configured to operably compare the current sense signal with the ramp signal during the first duration, and generate a corresponding first current during the first duration according to a difference between the current sense signal and the ramp signal; a second OTA, which is an OTA different from the first OTA, wherein the second OTA is configured to operably compare the current sense signal with the ramp signal during the second duration, and generate a corresponding second current during the second duration according to the difference between the current sense signal and the ramp signal; a first capacitor configured to be operably charged by the first current to generate the first signal; and a second capacitor configured to be operably charged by the second current to generate the second signal.

In one embodiment, the emulator control circuit includes: an operational trans-impedance amplifier (OTA), wherein the same single OTA is configured to operably compare the current sense signal with the ramp signal during the first duration and the second duration, respectively, wherein the first duration and the second duration are within different cycle periods, and respectively generate a corresponding first current during the first duration and a corresponding second current during the second duration according to differences between the current sense signal and the ramp signal; a first capacitor configured to be operably charged by the first current to generate the first signal; and a second capacitor configured to be operably charged by the second current to generate the second signal.

In one embodiment, the ramp signal generation circuit includes: a first conversion circuit coupled to the emulator control circuit, wherein the first conversion circuit is configured to operably generate a first ramp current according to the first signal; a second conversion circuit coupled to the emulator control circuit, wherein the second conversion circuit is configured to operably generate a second ramp current according to the second signal; a ramp capacitor, which is coupled to the first conversion circuit and the second conversion circuit, wherein the ramp capacitor is configured to be operably charged and discharged through the first ramp current and the second ramp current, to generate the ramp signal; and a first ramp switch coupled between the first conversion circuit and the ramp capacitor, wherein the first ramp switch is configured to operably switch to determine whether the first ramp current charges the ramp capacitor, wherein a switching time of the first ramp switch is synchronous with a switching time of the high side switch or the low side switch.

In one embodiment, the ramp signal generation circuit preferably further includes: a second ramp switch coupled between the second conversion circuit and the ramp capacitor, wherein the second ramp switch is configured to operably switch to determine whether the second ramp current discharges the ramp capacitor, wherein a switching time of the second ramp switch is synchronous with a switching time of the other of the high side switch and the low side switch.

In one embodiment, under a situation where the inductor current is zero, the ramp signal generation circuit is configured to operably control the first ramp current and/or the second ramp current further according to a zero current signal, so as to correspondingly cease charging and/or discharging the ramp capacitor, so that the inductor current is emulated to be zero.

In one embodiment, the ramp signal generation circuit further includes: a zero current switch coupled between the second conversion circuit and the ramp capacitor, wherein the zero current switch is configured to operably determine whether the second ramp current discharges the ramp capacitor according to the zero current signal.

From another perspective, the present invention provides an inductor current emulation method for use in a switching regulator, the switching regulator being configured to operably control a high side switch and/or a low side switch of a power stage circuit of the switching regulator, so as to convert an input voltage to an output voltage, wherein the inductor current emulation method is configured to operably generate a ramp signal for emulating an inductor current flowing through an inductor of the power stage circuit; the inductor current emulation method comprising: selecting and sensing a high side switch current flowing through the high side switch or a low side switch current flowing through the low side switch, so as to generate a current sense signal; obtaining a first difference integration value of differences between the current sense signal and a ramp signal during a first duration, to generate a first signal; obtaining a second difference integration value of differences between the current sense signal and the ramp signal during a second duration, to generate a second signal; and generating the ramp signal according to the first signal and the second signal; wherein a center time point of the first duration is different from a center time point of the second duration.

In one embodiment, the inductor current emulation method further comprises: comparing the current sense signal with the ramp signal, to generate the differences between the current sense signal and the ramp signal.

In one embodiment, the step of comparing the current sense signal with the ramp signal, to generate the differences between the current sense signal and the ramp signal further includes: feedforwarding the current sense signal and the ramp signal, so as to expedite regulation of the ramp signal.

In one embodiment, the inductor current emulation method further comprises: comparing the current sense signal with the ramp signal during the first duration and the second duration via a same single operational trans-impedance amplifier (OTA), and generating a corresponding first current during the first duration and a corresponding second current during the second duration according to the differences between the current sense signal and the ramp signal; charging a first capacitor via the first current, so as to generate the first signal; and charging a second capacitor via the second current, so as to generate the second signal.

In one embodiment, the inductor current emulation method further comprises: comparing the current sense signal with the ramp signal during the first duration via a first operational trans-impedance amplifier (OTA), and generating a corresponding first current during the first duration according to the difference between the current sense signal and the ramp signal; comparing the current sense signal with the ramp signal during the second duration via a second OTA which is an OTA different from the first OTA, and generating a corresponding second current during the second duration via the second OTA according to the difference between the current sense signal and the ramp signal; charging a first capacitor via the first current, so as to generate the first signal; and charging a second capacitor via the second current, so as to generate the second signal.

In one embodiment, the inductor current emulation method further comprises: comparing the current sense signal with the ramp signal during the first duration and the second duration via a same single operational trans-impedance amplifier (OTA), wherein the first duration and the second duration are within different cycle periods from each other, and generating a corresponding first current during the first duration and a corresponding second current during the second duration according to the differences between the current sense signal and the ramp signal; charging a first capacitor via the first current, so as to generate the first signal; and charging a second capacitor via the second current, so as to generate the second signal.

In one embodiment, the inductor current emulation method further comprises: generating a first ramp current according to the first signal; generating a second ramp current according to the second signal; charging and discharging a ramp capacitor by the first ramp current and the second ramp current, respectively; and switching a first ramp switch, to determine whether the first ramp current charges the ramp capacitor, wherein a switching time of the first ramp switch is synchronous with a switching time of one of the high side switch and the low side switch.

In one embodiment, the inductor current emulation method further comprises: switching a second ramp switch, to determine whether the second ramp current discharges the ramp capacitor, wherein a switching time of the second ramp switch is synchronous with a switching time of the other of the high side switch and the low side switch.

In one embodiment, the inductor current emulation method further comprises: under a situation where the inductor current is zero, controlling the first ramp current and/or the second ramp current according to a zero current signal, so as to correspondingly cease charging and/or discharging the ramp capacitor, so that the inductor current is emulated to be zero.

In one embodiment, the inductor current emulation method further comprises: determining whether the second ramp current discharges the ramp capacitor according to the zero current signal.

The objectives, technical details, features, and effects of the present invention will be better understood with regard to the detailed description of the embodiments below, with reference to the attached drawings.

DESCRIPTION OF THE PREFERRED EMBODIMENTS

The drawings as referred to throughout the description of the present invention are for illustration only, to show the interrelations between the circuits and the signal waveforms, but not drawn according to actual scale of circuit sizes and signal amplitudes and frequencies.

Figure 1:
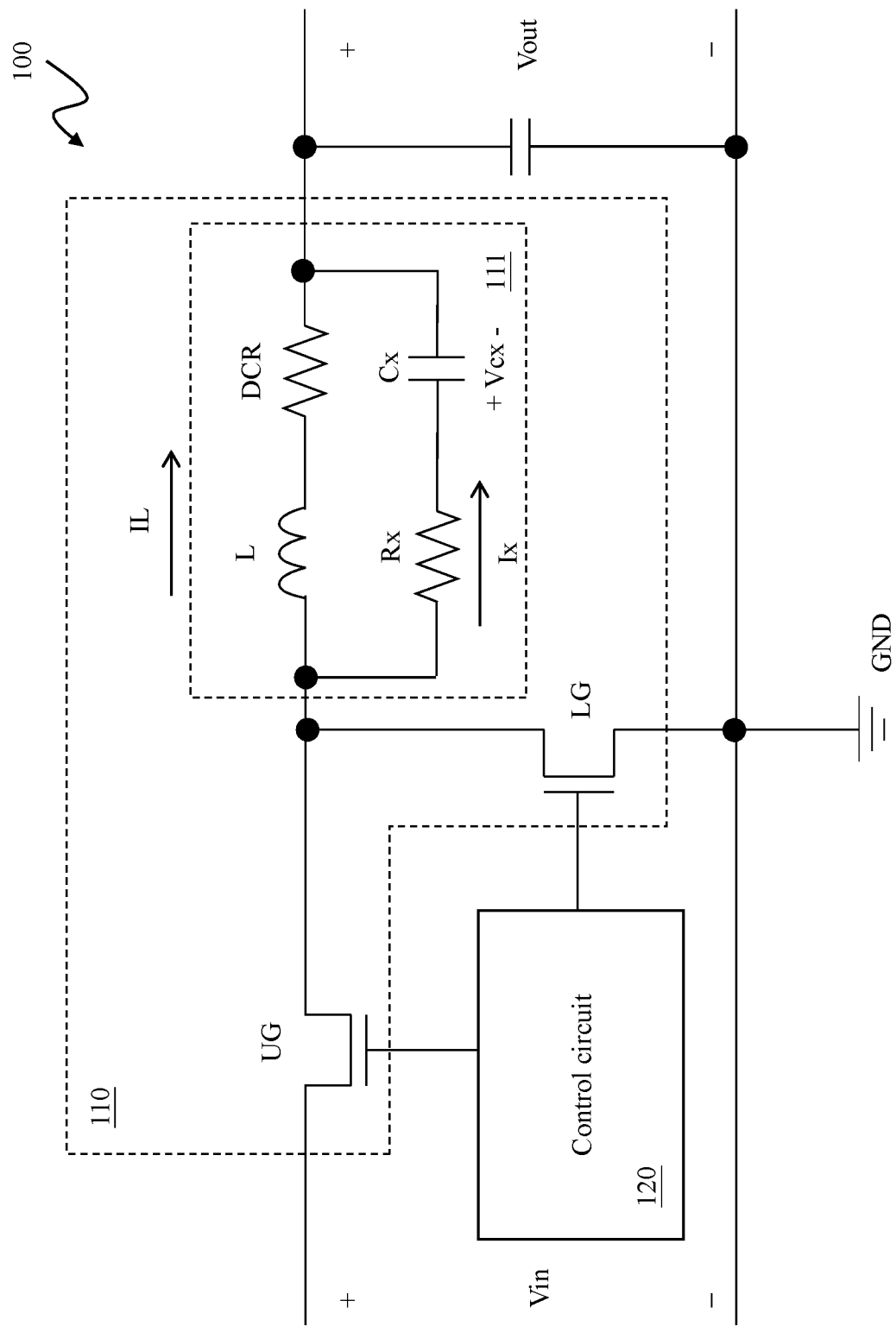
FIG. 1 shows a schematic diagram of a conventional switching regulator having an inductor current emulator circuit.
Figure 2A:
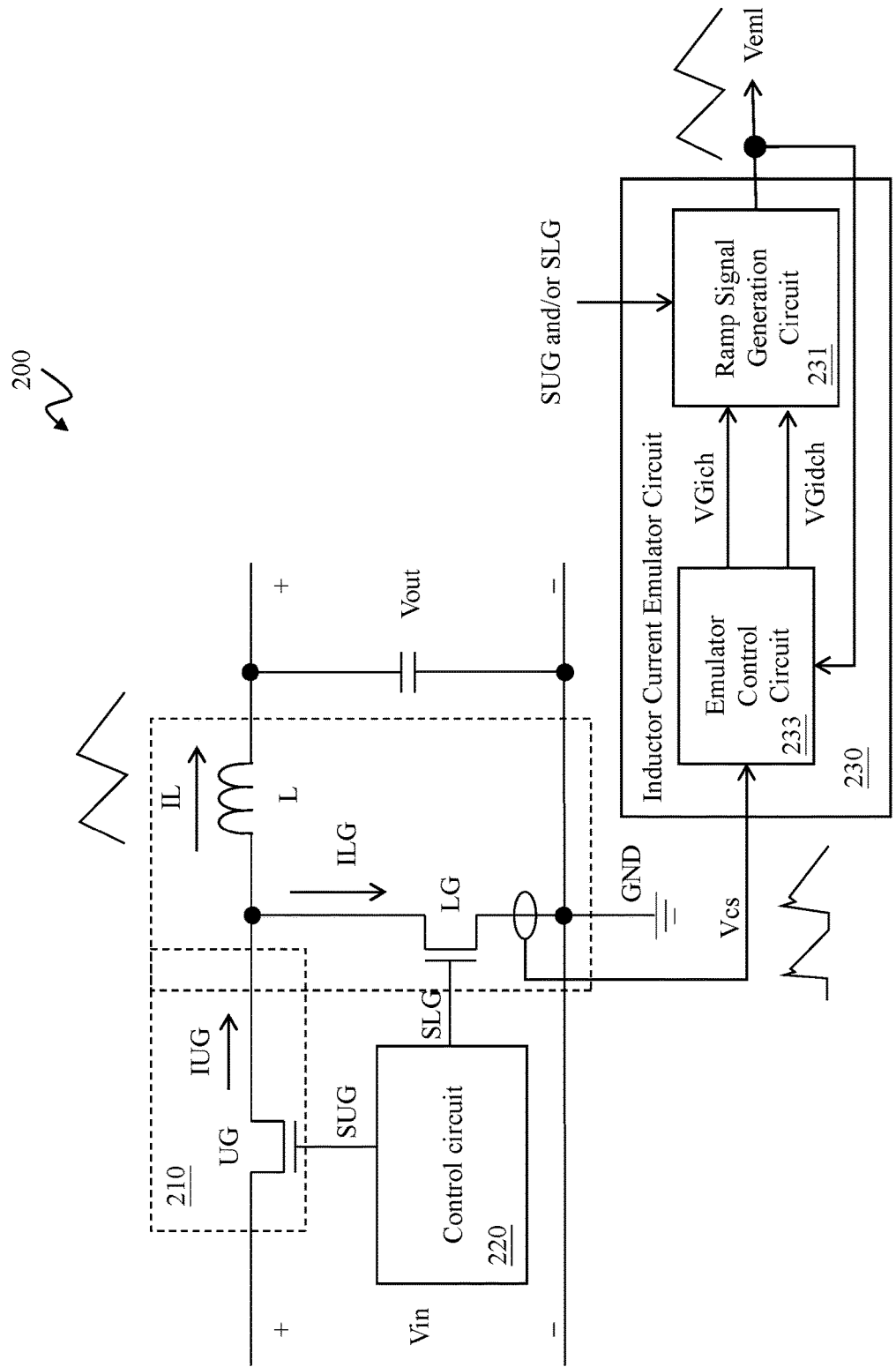
FIGS. 2A-2D show a schematic diagram of a first embodiment of the present invention.

Please refer to FIGS. 2A-2D, which show a schematic diagram of a first embodiment of the present invention. FIG. 2A shows a schematic diagram of an inductor current emulator circuit (i.e., inductor current emulator circuit 230) according to an embodiment of the present invention. As shown in FIG. 2A, the switching regulator 200 is configured to operably convert an input voltage Vin to an output voltage Vout. The switching regulator 200 comprises a power stage circuit 210 and a control circuit 220. The power stage circuit 210 is configured to operably control a high side switch UG and a low side switch LG according to at least one corresponding driving signal (for example but not limited to a corresponding high side driving signal SUG and a corresponding low side driving signal SLG as shown in FIG. 2A), respectively, so as to convert the input voltage Vin to the output voltage Vout. The control circuit 220 is coupled to the power stage circuit 210 and is configured to operably generate the above-mentioned high side driving signal SUG and low side driving signal SLG. The power stage circuit is not limited to being implemented as the power stage circuit 210 (i.e., a buck power stage circuit) as shown in FIG. 2A; according to the present invention, the power stage circuit can be implemented as, for example but not limited to, a synchronous or asynchronous buck, boost, inverting, buck-boost or inverting-boost power stage circuits, as shown in FIGS. 13A-13J.

An emulator control circuit 230 is configured to operably generate a ramp signal Veml for emulating an inductor current IL flowing through an inductor L of the power stage circuit 210. As shown in FIG. 2A, the emulator control circuit 230 comprises: a ramp signal generation circuit 231 and an emulator control circuit 233. The ramp signal generation circuit 231 is configured to operably generate the ramp signal Veml according to a first signal VGich and a second signal VGidch. The emulator control circuit 233 is coupled to the power stage circuit 210 and the ramp signal generation circuit 231. The emulator control circuit 233 is configured to operably generate the first signal VGich and the second signal VGidch according to a current sense signal Vcs and the ramp signal Veml. In this embodiment, the current sense signal Vcs is related to a low side switch current ILG flowing through the low side switch LG. In another embodiment, the current sense signal Vcs can be related to a high side switch current IUG flowing through the high side switch UG, and in this case the relevant sensing circuit can be coupled to the high side switch UG. To fully emulate the inductor current IG, in one embodiment, a duration of a rising portion of the ramp signal Veml coincides with an ON duration Ton of the high side switch UG, whereas, a duration of a falling portion of the ramp signal Veml coincides with an OFF duration Toff of the high side switch UG. In such an embodiment, the ramp signal generation circuit 231 generates the ramp signal Veml further according to the high side driving signal SUG and/or the low side driving signal SLG.

Figure 2B:
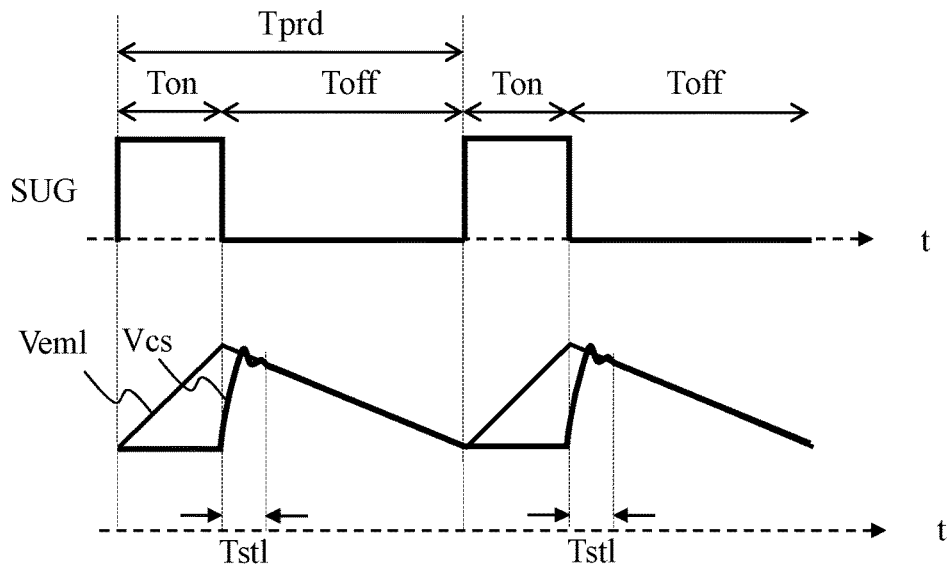

Please refer to FIG. 2B, which illustrates waveforms of the signals corresponding to the present invention. The upper portion of FIG. 2B illustrates the waveform diagram of the high side driving signal SUG, while, the lower portion of FIG. 2B illustrates the waveform diagram of the current sense signal Vcs and the ramp signal Veml. In the waveform diagram of the high side driving signal SUG, one cycle period Tprd includes an ON duration Ton and an OFF duration Toff, wherein in the ON duration Ton, the high side switch UG is in ON operation and the low side switch LG is in OFF operation, whereas, in the OFF duration Toff, the high side switch UG is in OFF operation and the low side switch LG is in ON operation (in continuous conduction mode (CCM)). Please refer to the waveform diagram of the current sense signal Vcs and the ramp signal Veml (i.e., the lower portion of FIG. 2B) along with FIG. 2A. In this embodiment, the current sense signal Vcs is related to a low side switch current ILG flowing through the low side switch LG. The current sense signal Vcs can be obtained from, for example but not limited to, a voltage drop across a resistor connected in series to the low side switch LG. Current sensing by a sensing resistor is well known by those skilled in this art, so the details thereof are not redundantly explained here. In this embodiment, because the current sense signal Vcs represents the low side switch current ILG flowing through the low side switch LG only when the low side switch LG is ON, the current sense signal Vcs does not represent the low side switch current ILG when the high side switch UG is in ON operation, or, from one perspective, because the low side switch LG is OFF during the ON duration Ton of the high side switch UG, the current sense signal Vcs indicates that the low side switch current ILG is zero in this duration. It is noteworthy that, during the ON duration Ton, the low side switch current ILG is unable to reflect the inductor current IL. Besides, because the low side driving signal SLG is complementary to the high side driving signal SUG and because the measurement of a low side switch current ILG has its limitation in practical operation, for the current sense signal Vcs to more accurately represent the low side switch current ILG, it is preferred to measure the current sense signal Vcs after a settle time Tstl after when the low side switch LG is turned ON (i.e., when the high side driving signal SUG is switched to a low level). The settle time Tstl is a duration during which the current sense signal Vcs is unstable. The current sense signal Vcs is relatively more stable after the settle time Tstl, which is well known to those skilled in the art, so the details thereof are not redundantly explained here.

Figure 2C:
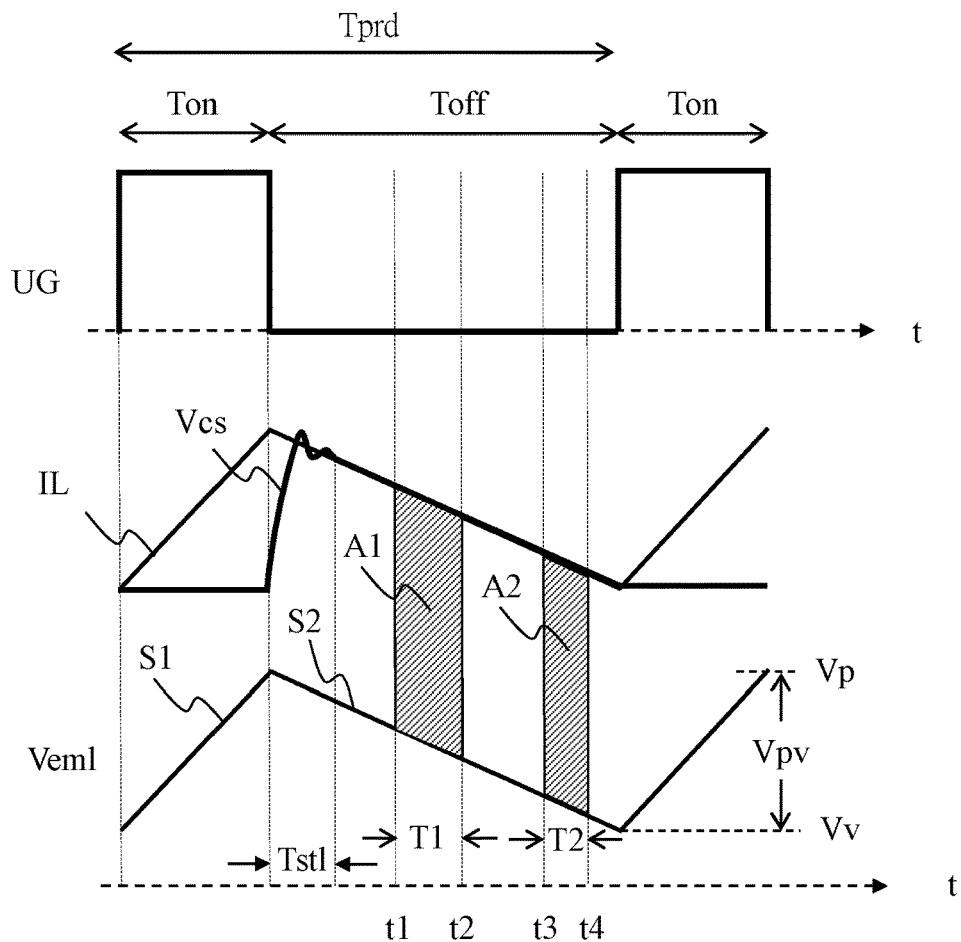

Please refer to FIG. 2A in conjugation with FIG. 2C. The ramp signal Veml is generated by the ramp signal generation circuit 231 according to the first signal VGich and the second signal VGidch, and the ramp signal Veml is configured to operably emulate an inductor current IL. The emulator control circuit 233 performs a first integration of differences between the current sense signal Vcs and the ramp signal Veml during a first duration T1 (as shown by the duration ranging from the timing point t1 to the timing point t2 in FIG. 2C), to obtain a first difference integration value between the current sense signal Vcs and the ramp signal Veml (as shown by the shaded area A1 in FIG. 2C) of the first integration, so as to generate the first signal VGich. The emulator control circuit 233 performs a second integration of differences between the current sense signal Vcs and the ramp signal Veml during a second duration T2 (as shown by the duration ranging from the timing point t3 to the timing point t4 in FIG. 2C) , to obtain a second difference integration value between the current sense signal Vcs and the ramp signal Veml (as shown by the shaded area A2 in FIG. 2C), so as to generate the second signal VGidch. It is noteworthy that, in the embodiment of FIG. 2C, the first difference integration value indicates a result of integration which is performed on the differences between the current sense signal Vcs and the ramp signal Veml, while in other embodiments, the first difference integration value can indicate a difference between two integration results respectively performed on the current sense signal Vcs and the ramp signal Veml; the details of the latter will be explained later.

The center time point of the first duration T1 is different from the center time point of the second duration T2. Besides, in one embodiment, both the first duration T1 and the second duration T2 are greater than zero. And, form one perspective, in this embodiment, the low side switch current ILG will be the same as the inductor current IL only under a situation where the low side switch LG is ON; therefore, in this embodiment, both the first duration T1 and the second duration T2 are within an ON duration of the low side switch LG (i.e., within an OFF duration Toff of the high side switch UG).

In one embodiment, the emulator control circuit 233 is configured to operably generate the first signal VGich and the second signal VGidch for controlling the ramp signal generation circuit 231, to regulate the result of the first integration and the result (as shown by the shaded area A1 in FIG. 2C) of the second integration to zero (as shown by the shaded area A2 in FIG. 2C).

As shown in FIG. 2C, the first duration T1 is a time period within an OFF duration Toff wherein the high side switch UG is in OFF operation (i.e., within an ON duration wherein the low side switch LG is in ON operation), for example after a settle time Tstl from when the high side switch UG is switched from ON to OFF (i.e., from when the low side switch LG is switched from OFF to ON). The second duration T2 is another time period, i.e. a different time period, within the same OFF duration Toff; note that "another time period" or "different time period", means that the center time point of the first duration T1 is different from the center time point of the second duration T2.

Figure 2D:
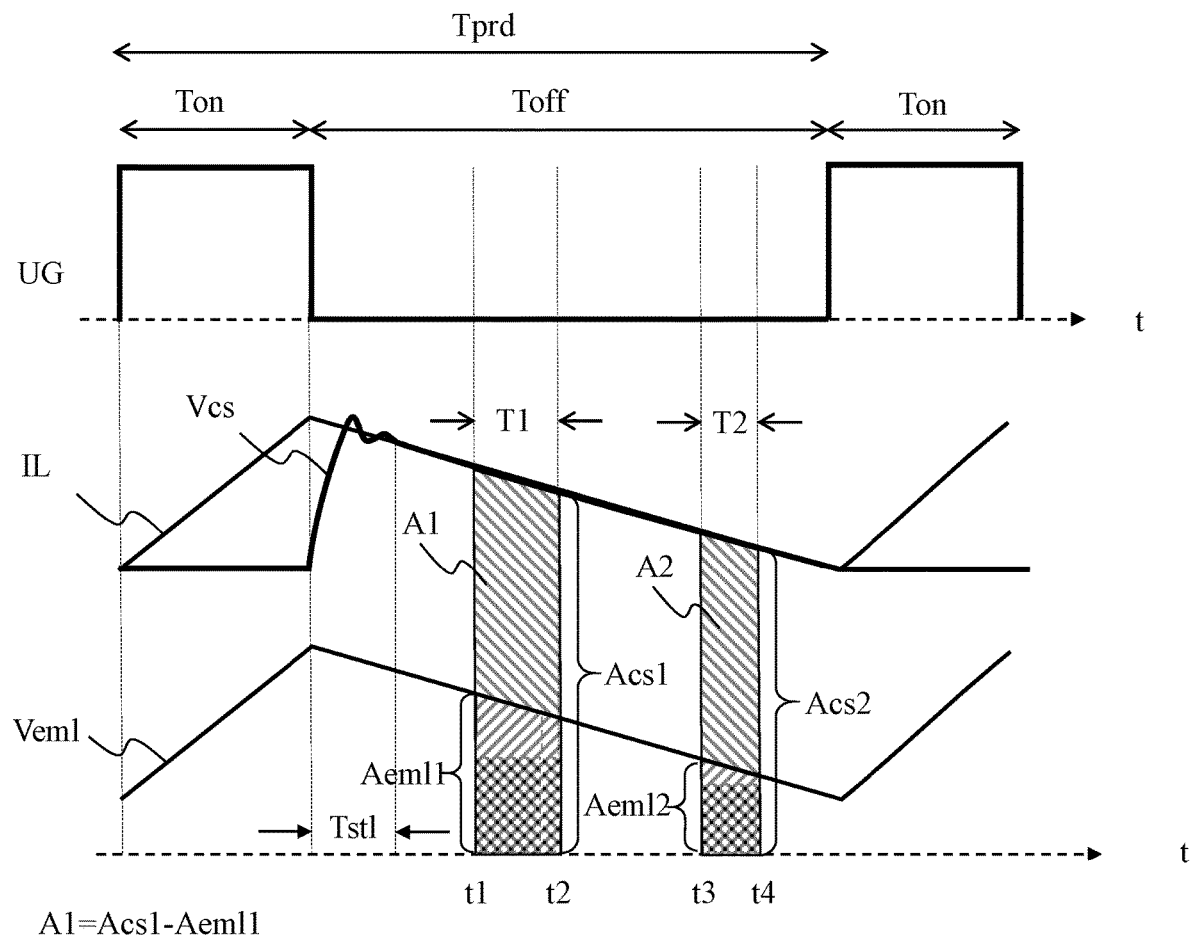

Please refer to FIG. 2A in conjugation with FIG. 2D. The ramp signal Veml is generated by the ramp signal generation circuit 231 according to a first signal VGich and a second signal VGidch, and the ramp signal Veml is configured to operably emulate the inductor current IL. The emulator control circuit 233 respectively performs integrations on the current sense signal Vcs and the ramp signal Veml during the first duration T1 (as shown by the duration ranging from the timing point t1 to the timing point t2 in FIG. 2D) and obtains two respective integration results corresponding to the current sense signal Vcs and the ramp signal Veml (as shown by the shaded area Acs1 and the shaded area Aeml1 in FIG. 2D) ; and, the emulator control circuit 233 obtains a difference between the shaded area Acs1 and the shaded area Aeml1 (i.e., the shaded area A1), which is the first difference integration value, to generate the first signal VGich accordingly. Also, the emulator control circuit 233 respectively performs integrations on the current sense signal Vcs and the ramp signal Veml during the second duration T2 (as shown by the duration ranging from the timing point t3 to the timing point t4 in FIG. 2D) and obtains two respective integration results corresponding to the current sense signal Vcs and the ramp signal Veml (as shown by a shaded area Acs2 and a shaded area Aeml2 in FIG. 2D); and, the emulator control circuit 233 obtains a difference between the shaded area Acs2 and the shaded area Aeml2 (i.e., the shaded area A2), which is the second difference integration value, to generate the second signal VGidch accordingly. It is noteworthy that, in the embodiment of FIG. 2D, the first difference integration value is obtained by first performing integrations on the current sense signal Vcs and the ramp signal Veml respectively during the duration ranging from the timing point t1 to the timing point t2 to obtain two integration results corresponding to the current sense signal Vcs and the ramp signal Veml, and subsequently obtaining a difference therebetween to obtain the first difference integration value. Besides, in the embodiment of FIG. 2D, the second difference integration value is obtained by first performing integrations on the current sense signal Vcs and the ramp signal Veml respectively during the duration ranging from the timing point t3 to the timing point t4 to obtain two integration results corresponding to the current sense signal Vcs and the ramp signal Veml, and subsequently obtaining a difference therebetween to obtain a second difference integration value.

In one embodiment, both the first duration T1 and the second duration T2 are within a same OFF duration Toff. In another embodiment, both the first duration T1 and the second duration T2 are within a same OFF duration Toff, and partially overlap with each other. In yet another embodiment, the first duration T1 and the second duration T2 are within different OFF durations Toff; for example, the first duration T1 and the second duration T2 are alternatingly within different consecutive OFF durations Toff. In still another embodiment, the center time point of the first duration T1 precedes the center time point of the second duration T2. In still another embodiment, the center time point of the first duration T1 is behind the center time point of the second duration T2. In other embodiments, under a situation where the current sense signal Vcs is related to a high side switch current IUG flowing through the high side switch UG, it is also practicable and within the scope of the present invention that all the OFF durations Toff described in above-mentioned embodiments can be replaced by the ON duration Ton. That is, in one embodiment, the first duration T1 and the second duration T2 can be two different durations having different respective center time points, after a settle time Tstl from when one of the high side switch UG and the low side switch LG is switched to an ON operation.

In one embodiment, the value of the ramp signal Veml is regulated to the value of the inductor current IL multiplied by a predetermined real number, and further plus a predetermined compensation value. This is in order to prevent the value of the ramp signal Veml from becoming a negative value. That is, in one embodiment, the value of the ramp signal Veml is always not smaller than zero. Because the value of the inductor current IL may be negative, if the value of the ramp signal Veml is a negative value, the complexity to design the emulator control circuit 233 would greatly increase. Accordingly, the predetermined real number and the predetermined compensation value can be adjusted to avoid the above situation, and to meet other practical needs. It is noteworthy that, in one embodiment, the value of the ramp signal Veml is not smaller than zero, and under such circumstance, the inductor current IL expressed by the current sense signal Vcs is accordingly and correspondingly adjusted, so that the value of the current sense signal Vcs will not be smaller than zero.

Figure 3:
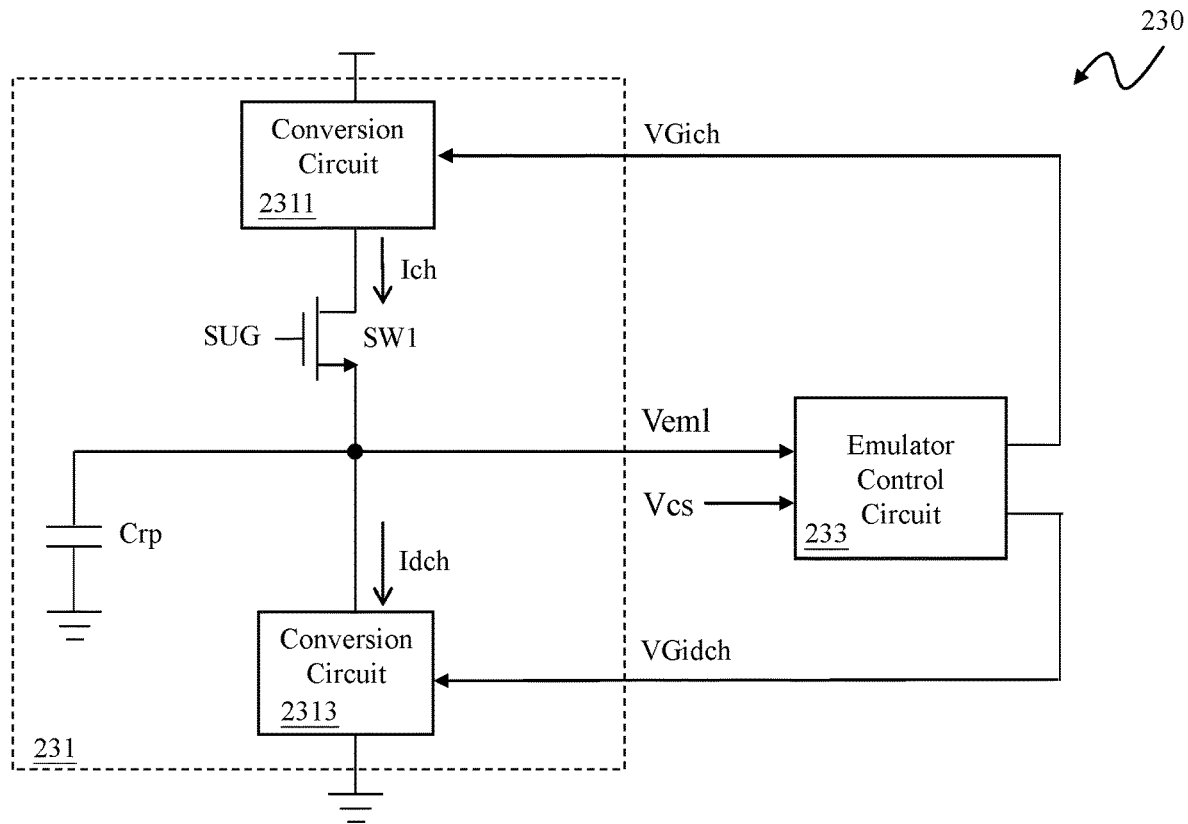
FIG. 3 shows a schematic diagram of a second embodiment of the present invention.

Please refer to FIG. 3, which shows a schematic diagram of a second embodiment of the present invention. FIG. 3 shows a schematic diagram of an inductor current emulator circuit (i.e., inductor current emulator circuit 230) according to a specific embodiment of the present invention. Please refer to FIG. 3 along with FIG. 2A. As shown in FIG. 3, the emulator control circuit 230 comprises: a ramp signal generation circuit 231 and an emulator control circuit 233. The ramp signal generation circuit 231 is configured to operably generate the ramp signal Veml according to the first signal VGich and the second signal VGidch, to emulate the inductor current IL flowing through an inductor L of the power stage circuit 210. That is, the ramp signal Veml can adaptively emulate a waveform of the inductor current IL and show a current value of the inductor current IL. In this embodiment, the ramp signal generation circuit 231 includes: conversion circuits 2311 and 2313 (which function as first and second conversion circuits respectively) , a ramp switch SW1 and a ramp capacitor Crp. As shown in FIG. 3, the conversion circuit 2311 is coupled to the emulator control circuit 233; the conversion circuit 2311 is configured to operably generate a first ramp current Ich according to the first signal VGich. The conversion circuit 2313 is coupled to the emulator control circuit 233; the conversion circuit 2313 is configured to operably generate a second ramp current Idch according to the second signal VGidch.

Please still refer to FIG. 3. The ramp switch SW1 (which functions as a first ramp switch) is coupled between the conversion circuit 2311 and the ramp capacitor Crp. The ramp switch SW1 is configured to operably switch to determine whether or not the first ramp current Ich charges the ramp capacitor Crp. For example, the ramp switch SW1 can operate according to the high side driving signal SUG (i.e., the switching time of the ramp switch SW1 is synchronous with the switching time of the high side switch UG), to determine whether the first ramp current Ich will flow through the ramp switch SW1. A difference of the first ramp current Ich minus the second ramp current Idch will charge the ramp capacitor Crp, thus generating a rising portion of the ramp signal Veml. The conversion circuit 2313 is configured to operably generate a second ramp current Idch according to the second signal VGidch; the generated second ramp current Idch will discharge the ramp capacitor Crp, thus generating a falling portion of the ramp signal Veml. In other words, in this embodiment, during an ON duration Ton of the high side switch UG, the ramp signal generation circuit 231 charges the ramp capacitor Crp by a difference of the first ramp current Ich minus the second ramp current Idch, thus generating a rising portion of the ramp signal Veml, and during an OFF duration Toff of the high side switch UG, the ramp signal generation circuit 231 discharges the ramp capacitor Crp by the second ramp current Idch, thus generating a falling portion of the ramp signal Veml. From one perspective, the duration of the rising portion of the ramp signal Veml is coincide with the ON duration Ton of the high side switch UG, whereas, the duration of the falling portion of the ramp signal Veml is coincide with the OFF duration Toff of the high side switch UG.

As described above, the first signal VGich and the second signal VGidch determine the corresponding first ramp current Ich and the corresponding second ramp current Idch, so as to charge and discharge the ramp capacitor Crp to generate the rising portion and the falling portion of the ramp signal Veml. From one perspective, in this embodiment, the conversion circuits 2311 and 2313 determine the rising slope and the falling slope of the ramp signal Veml according to the first signal VGich and the second signal VGidch, so that the ramp signal Veml can fully emulate the inductor current IG. In one embodiment, the conversion circuit 2311 can be, for example but not limited to, a current source circuit, whereas, the conversion circuit 2313 can be, for example but not limited to, a current sink circuit. However, it should be understood that the implementation of the conversion circuit 2311 as a current source circuit and the implementation of the conversion circuit 2313 as a current sink circuit are only illustrative examples, but not for limiting the scope of the present invention.

Please refer to FIG. 2C. Generally, under a premise that the rising duration and the falling duration are given values (e.g., in a case as described above wherein the rising duration of the ramp signal Veml is coincide with the ON duration Ton of the high side switch UG and the falling duration of the ramp signal Veml is coincide with the OFF duration Toff of the high side switch UG), a ramp signal (e.g., the ramp signal Veml) can be defined via at least two of the rising slope S1, the falling slope S2, a peak Vp, a valley Vv and a peak-to-valley value Vpv of the ramp signal. Accordingly, in one embodiment, the ramp signal generation circuit 231 as shown in FIG. 2A can determine at least two of the group consisting of the rising slope S1, the falling slope S2, the peak Vp, the valley Vv and the peak-to-valley value Vpv of the ramp signal Veml according to the first signal VGich and the second signal VGidch, so as to generate the ramp signal Veml. It is noteworthy that, no matter what combinations of the above-mentioned parameters are adopted to generate and control the ramp signal Veml, as long as the ramp signal generation circuit 231 is controlled according to the first signal VGich and the second signal VGidch so that the result of the first integration (e.g., as shown by the shaded area A1 in FIG. 2C) and the result of the second integration (e.g., as shown by the shaded area A2 in FIG. 2C) are regulated to zero, it falls within the spirit of the present invention. For simplicity, in the embodiments of FIG. 3 and the embodiments set forth hereinafter, examples are given in which the ramp signal Veml is determined through controlling the rising slope S1 and the falling slope S2; however, by controlling any other two of the above-mentioned parameters, those skilled in this art can readily achieve the same effects according to the teaching of the present invention.

Figure 4:
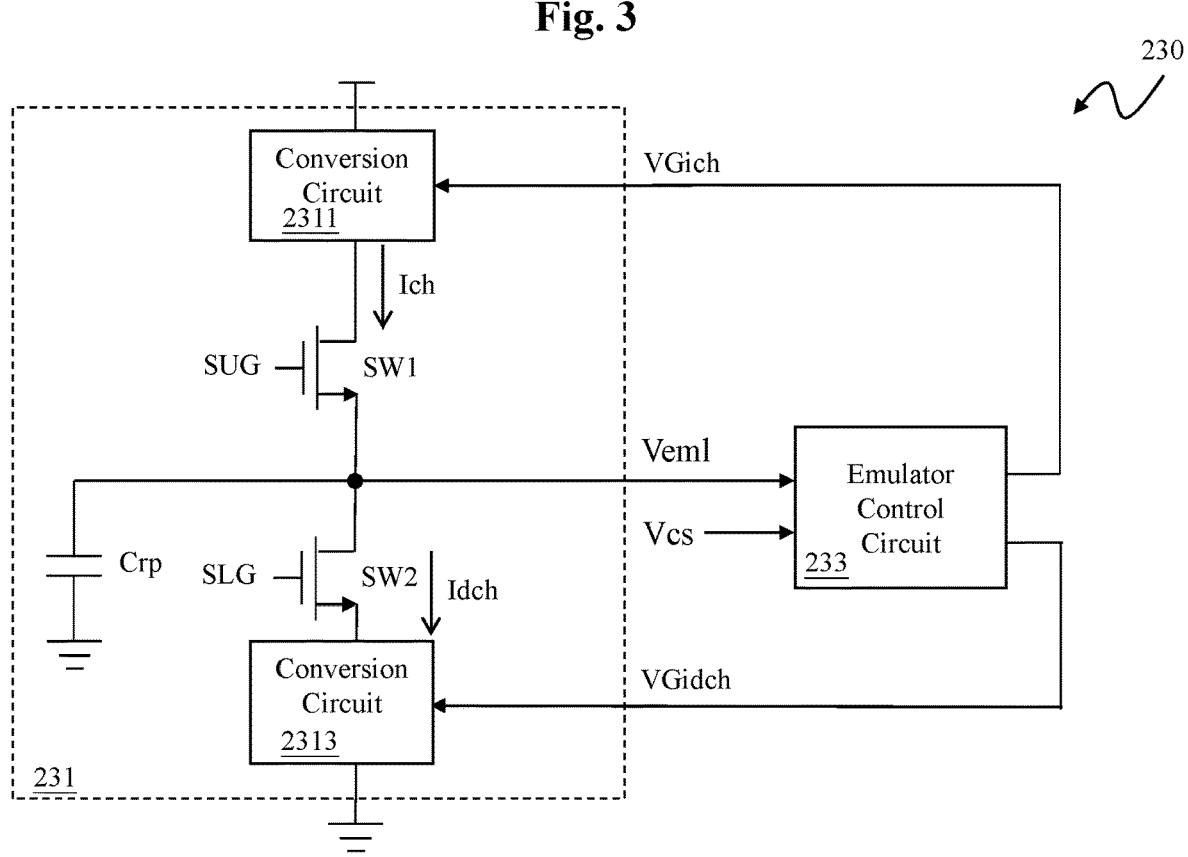
FIG. 4 shows a schematic diagram of a third embodiment of the present invention.

Please refer to FIG. 4, which shows a schematic diagram of a third embodiment of the present invention. This embodiment is similar to the second embodiment, but is different in that: in this embodiment, in addition to the conversion circuit 2311, the conversion circuit 2313, the ramp switch SW1 and the ramp capacitor Crp, the ramp signal generation circuit 231 further includes a ramp switch SW2. The ramp switch SW2 is coupled between the conversion circuit 2313 and the ramp capacitor Crp. The ramp switch SW2 is configured to operably determine whether the second ramp current Idch flows through the ramp switch SW2 according to for example the low side driving signal SLG, so as to discharge the ramp capacitor Crp, thus generating the falling portion of the ramp signal Veml. In other embodiment, it is also practicable and within the scope of the present invention that the ramp switch SW2 can operate according to a signal related to the high side driving signal SUG. Under such situation, as compared to the second embodiment, the relevant parameters of the conversion circuits 2311 and 2313 of this third embodiment may need to be correspondingly modified. More specifically, in this embodiment, during an ON duration Ton of the high side switch UG, the ramp signal generation circuit 231 charges the ramp capacitor Crp by the first ramp current Ich to generate the rising portion of the ramp signal Veml, and during an OFF duration Toff of the high side switch UG, the ramp signal generation circuit 231 discharges the ramp capacitor Crp by the second ramp current Idch to generate the falling portion of the ramp signal Veml.

Figure 5:
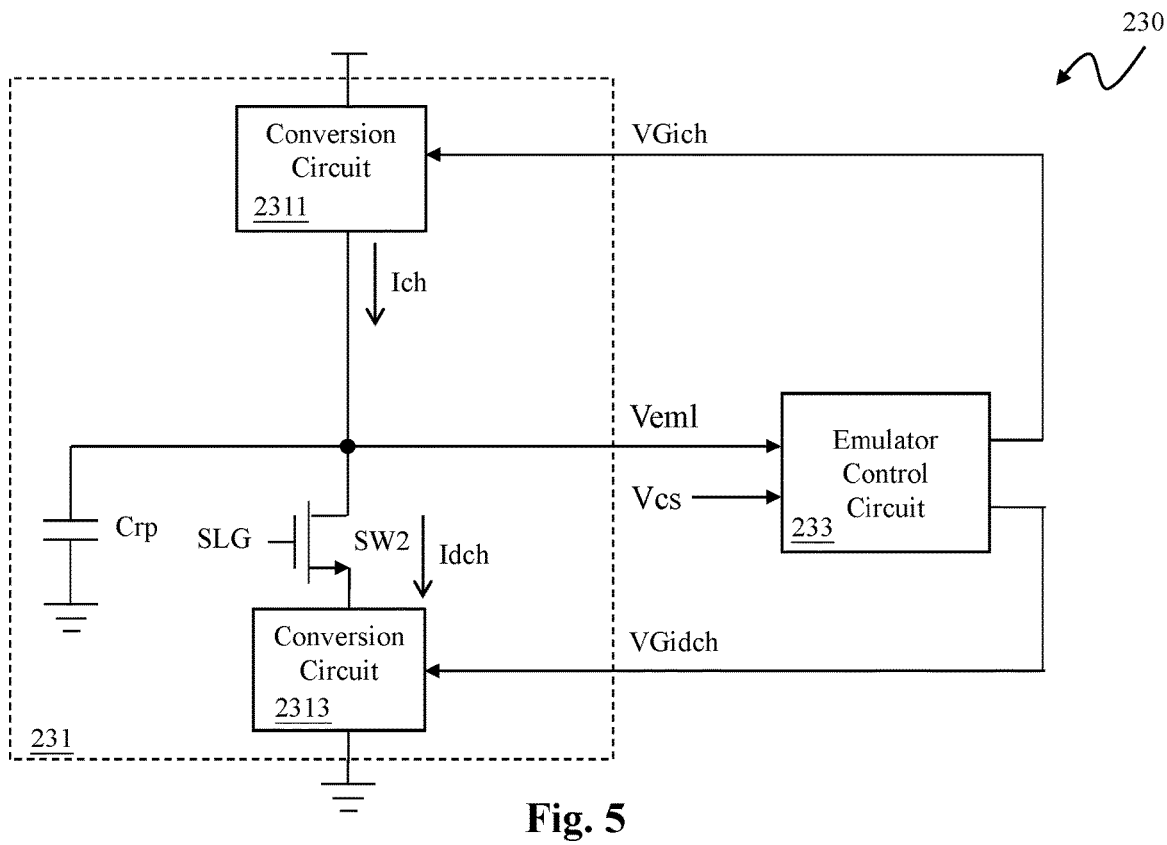
FIG. 5 shows a schematic diagram of a fourth embodiment of the present invention.

Please refer to FIG. 5, which shows a schematic diagram of a fourth embodiment of the present invention. This embodiment is similar to the third embodiment, but is different in that: in this embodiment, the ramp signal generation circuit 231 does not include a ramp switch SW1. Under such situation, as compared to the third embodiment, the relevant parameters of the conversion circuits 2311 and 2313 of this fourth embodiment need to be correspondingly modified.

Figure 6:
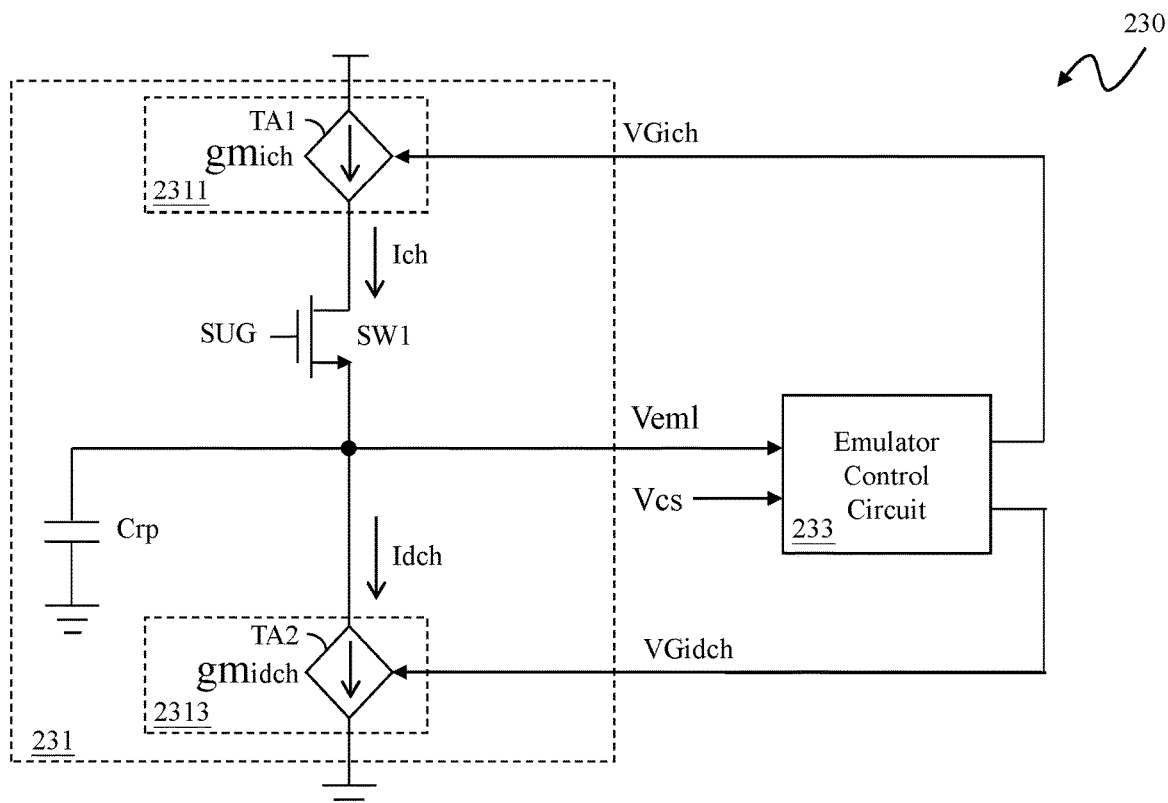
FIG. 6 shows a schematic diagram of a fifth embodiment of the present invention.

Please refer to FIG. 6, which shows a schematic diagram of a fifth embodiment of the present invention. FIG. 6 shows a schematic diagram of an inductor current emulator circuit (i.e., inductor current emulator circuit 230) according to a specific embodiment of the present invention. As shown in FIG. 6, the emulator control circuit 230 comprises: a ramp signal generation circuit 231 and an emulator control circuit 233. The ramp signal generation circuit 231 is configured to operably generate the ramp signal Veml according to the first signal VGich and the second signal VGidch, to emulate the inductor current IL flowing through the inductor L of the power stage circuit 210. In this embodiment, the ramp signal generation circuit 231 includes: a conversion circuit 2311 and a conversion circuit 2313, a ramp switch SW1 and a ramp capacitor Crp. The conversion circuit 2311 includes a transconductance amplifier TA1, whereas, the conversion circuit 2313 includes a transconductance amplifier TA2. As shown in FIG. 6, the transconductance amplifier TA1 has a transconductance gmich, which can convert a voltage of the first signal VGich to the first ramp current Ich. The transconductance amplifier TA2 has a transconductance gmidch, which can convert a voltage of the second signal VGidch to the second ramp current Idch.

Figure 7:
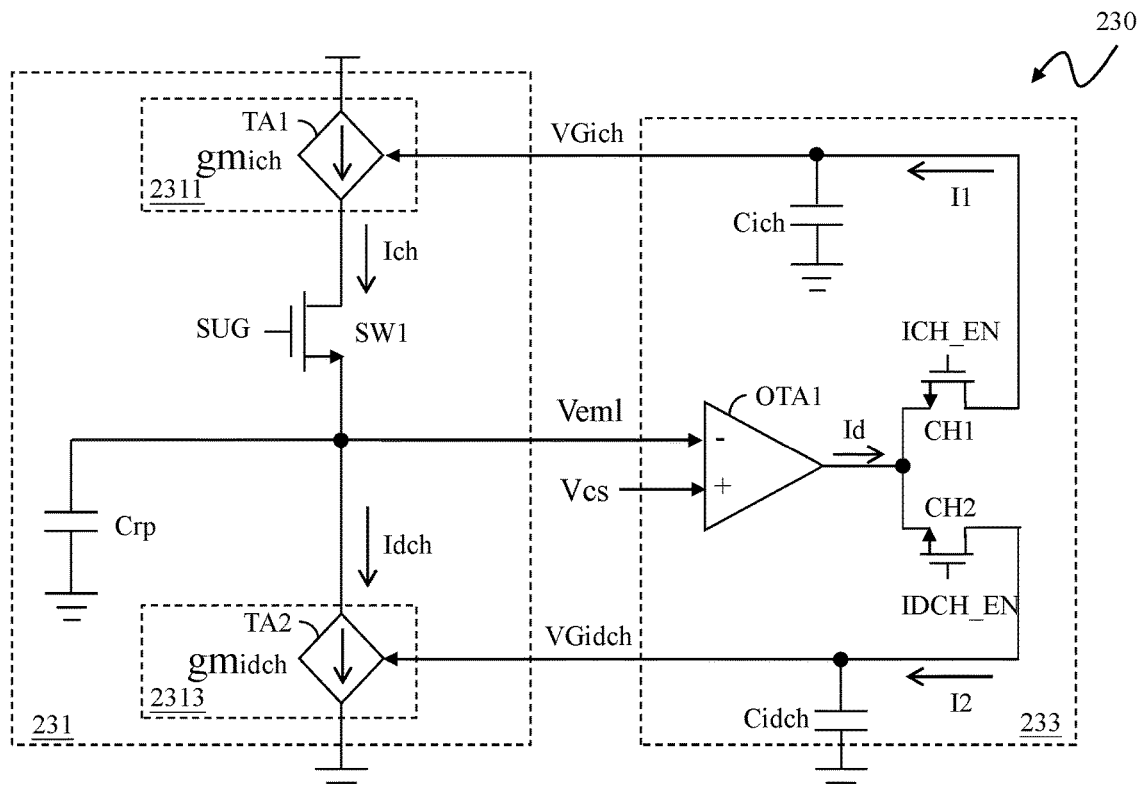
FIG. 7 shows a schematic diagram of a sixth embodiment of the present invention.

Please refer to FIG. 7, which shows a schematic diagram of a sixth embodiment of the present invention. FIG. 7 shows a schematic diagram of an inductor current emulator circuit (i.e., inductor current emulator circuit 230) according to a specific embodiment of the present invention. As shown in FIG. 7, the emulator control circuit 230 comprises: a ramp signal generation circuit 231 and an emulator control circuit 233. The ramp signal generation circuit 231 is configured to operably generate the ramp signal Veml according to the first signal VGich and the second signal VGidch, to emulate the inductor current IL flowing through the inductor L of the power stage circuit 210. In this embodiment, the emulator control circuit 233 includes: an operational trans-impedance amplifier (OTA) OTA1, switches CH1 and CH2, and capacitors Cich and Cidch. The operational trans-impedance amplifier is an amplifier circuit which converts a voltage difference to a current signal, which is well known to those skilled in the art, so the details thereof are not redundantly explained here.

In this embodiment, the emulator control circuit 233 compares the current sense signal Vcs with the ramp signal Veml during the first duration T1 and the second duration T2, via one same single operational trans-impedance amplifier OTA1 (which function as an amplifier circuit), to generate a corresponding first current I1 during the first duration T1 and a corresponding second current I2 during the second duration T2. The switch CH1 is coupled between the operational trans-impedance amplifier OTA1 and the capacitor Cich (which functions as a first capacitor). The switch CH1 operates according to an operation signal ICH_EN. During the first duration T1, a current Id generated by the operational trans-impedance amplifier OTA1 according to a difference between the current sense signal Vcs and the ramp signal Veml functions as the first current I1. The switch CH2 is coupled between the operational trans-impedance amplifier OTA1 and the capacitor Cidch (which functions as a second capacitor). The switch CH2 operates according to an operation signal IDCH_EN. During the second duration T2, the current Id generated by the operational trans-impedance amplifier OTA1 according to a difference between the current sense signal Vcs and the ramp signal Veml functions as the second current I2. The first current I1 charges the capacitor Cich (which is performing integration on the differences between the current sense signal Vcs and the ramp signal Veml during the first duration T1), so as to obtain a first difference integration value between the current sense signal Vcs and the ramp signal Veml, thus generating the first signal VGich. The second current I2 charges the capacitor Cidch (which is performing integration on the differences between the current sense signal Vcs and the ramp signal Veml during the second duration T2), so as to obtain a second difference integration value between the current sense signal Vcs and the ramp signal Veml, thus generating the second signal VGidch. That is, in this embodiment, the first signal VGich represents a result of the first integration, as shown by the shaded area A1 in FIG. 2C; the second signal VGidch represents a result of the second integration, as shown by the shaded area A2 in FIG. 2C.

Figure 8:
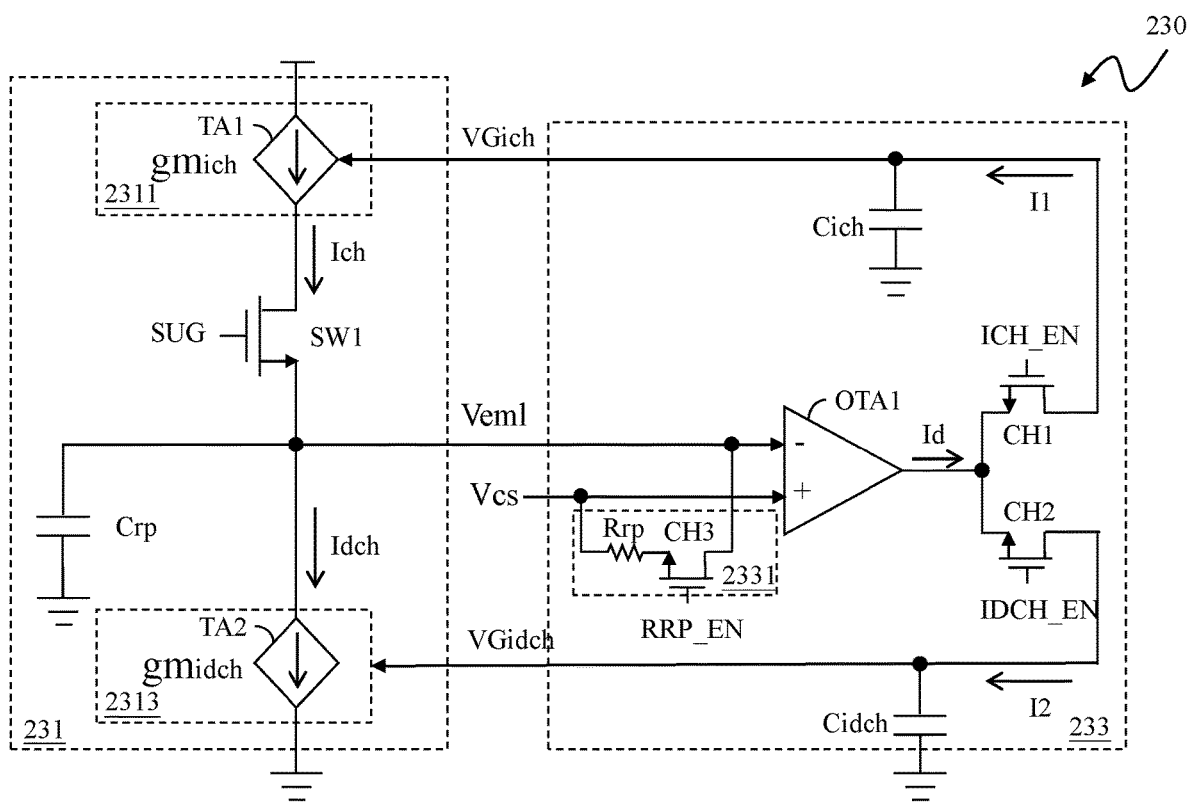
FIG. 8 shows a schematic diagram of a seventh embodiment of the present invention.

Please refer to FIG. 8, which shows a schematic diagram of a seventh embodiment of the present invention. FIG. 8 shows a schematic diagram of an inductor current emulator circuit (i.e., inductor current emulator circuit 230) according to a specific embodiment of the present invention. As shown in FIG. 8, the emulator control circuit 230 comprises: a ramp signal generation circuit 231 and an emulator control circuit 233. The ramp signal generation circuit 231 is configured to operably generate the ramp signal Veml according to the first signal VGich and the second signal VGidch, to emulate the inductor current IL flowing through the inductor L of the power stage circuit 210. In this embodiment, the emulator control circuit 233 includes: an operational trans-impedance amplifier (OTA) OTA1, switches CH1 and CH2, a feedforward circuit 2331 and capacitors Cich and Cidch.

This embodiment is similar to the sixth embodiment, but is different in that: in this embodiment, the emulator control circuit 233 further includes the feedforward circuit 2331. The feedforward circuit 2331 is coupled between two input terminals of the operational trans-impedance amplifier OTA1. The feedforward circuit 2331 is configured to operably feedforward the current sense signal Vcs and the ramp signal Veml, so as to expedite regulation of the ramp signal Veml. More specifically, as shown in FIG. 8, the feedforward circuit 2331 includes for example a resistor Rrp and a switch CH3. The resistor Rrp is connected in series with the switch CH3; the series circuit formed by the resistor Rrp connected in series with the switch CH3 is coupled between an inverse input terminal and a non-inverse input terminal of the operational trans-impedance amplifier OTA1. The switch CH3 operates according to an operation signal RRP_EN, to determine whether the resistor Rrp should connect the inverse input terminal with the non-inverse input terminal of the operational trans-impedance amplifier OTA1. Thus, when the switch CH3 is ON (e.g., during an initial period when the ramp signal Veml starts emulating the inductor current IL), by connecting the two input terminals of the operational trans-impedance amplifier OTA1 via the resistor Rrp, the ramp signal Veml becomes closer to the current sense signal Vcs, which can expediting regulation of the ramp signal, so that it takes a relatively shorter time for the emulator control circuit 233 of this embodiment to cause the ramp signal Veml to closely emulate the current sense signal Vcs.

Figure 9:
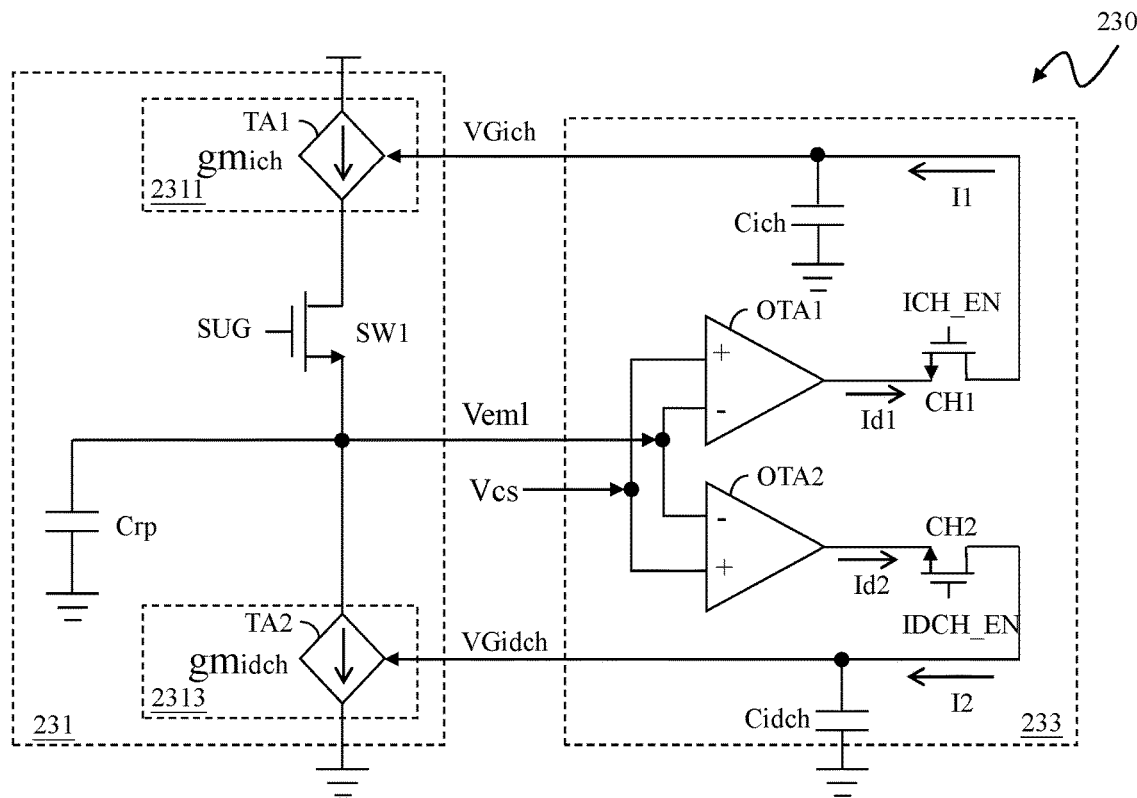
FIG. 9 shows a schematic diagram of an eighth embodiment of the present invention.

Please refer to FIG. 9, which shows a schematic diagram of an eighth embodiment of the present invention. FIG. 9 shows a schematic diagram of an inductor current emulator circuit (i.e., inductor current emulator circuit 230) according to a specific embodiment of the present invention. As shown in FIG. 9, the emulator control circuit 230 comprises: a ramp signal generation circuit 231 and an emulator control circuit 233. The ramp signal generation circuit 231 is configured to operably generate the ramp signal Veml according to the first signal VGich and the second signal VGidch, to emulate the inductor current IL flowing through the inductor L of the power stage circuit 210. In this embodiment, the emulator control circuit 233 includes: operational trans-impedance amplifiers (OTA) OTA1 and OTA2, switches CH1 and CH2 and capacitors Cich and Cidch.

In this embodiment, the operational trans-impedance amplifier OTA1 (which functions as a first operational trans-impedance amplifier) is configured to operably compare the current sense signal Vcs with the ramp signal Veml during the first duration T1, to generate a first current I1 according to a difference between the current sense signal Vcs and the ramp signal Veml during the first duration T1. Besides, the operational trans-impedance amplifier OTA2 (which functions as a second operational trans-impedance amplifier) is configured to operably compare the current sense signal Vcs with the ramp signal Veml during a second duration T2, to generate a second current I2 according to a difference between the current sense signal Vcs and the ramp signal Veml during the second duration T2. The switch CH1 is coupled between the operational trans-impedance amplifier OTA1 and a capacitor Cich (which functions as a first capacitor). The switch CH1 operates according to an operation signal ICH_EN. During the first duration T1, the operational trans-impedance amplifier OTA1 generates a current Id1 according to a difference between the current sense signal Vcs and the ramp signal Veml, and the switch CH1 converts it to a first current I1. The switch CH2 is coupled between the operational trans-impedance amplifier OTA2 and a capacitor Cidch (which functions as a second capacitor). The switch CH2 operates according to an operation signal IDCH_EN. During the second duration T2, the operational trans-impedance amplifier OTA2 generates a current Id2 according to a difference between the current sense signal Vcs and the ramp signal Veml, and the switch CH2 converts it to a second current I2. The first current I1 charges the capacitor Cich to obtain a first difference integration value of the differences between the current sense signal Vcs and the ramp signal Veml, thus generating the first signal VGich. The second current I2 charges the capacitor Cidch to obtain a second difference integration value of the differences between the current sense signal Vcs and the ramp signal Veml, thus generating the second signal VGidch. That is, in this embodiment, the first signal VGich represents a result of the first integration, as shown by the shaded area A1 in FIG. 2C, and the second signal VGidch represents a result of the second integration, as shown by the shaded area A2 in FIG. 2C.

This embodiment is similar to the sixth embodiment and the seventh embodiment, but is different in that: because this embodiment employs two different operational trans-impedance amplifiers OTA1 and OTA2, in this embodiment, the first duration T1 and the second duration T2 can overlap with each other. It is noteworthy that, because the sixth embodiment and the seventh embodiment adopt one single operational trans-impedance amplifier to generate the current Id during two different durations (i.e., the first duration T1 and the second duration T2), in the sixth embodiment and the seventh embodiment, the first duration T1 and the second duration T2 cannot overlap with each other. In another embodiment, the first duration T1 and the second duration T2 can be arranged to be within different cycle periods (e.g., in an alternating manner), and the first and second difference integration values of the differences between the current sense signal Vcs and the ramp signal Veml can be generated at different cycle periods, respectively, to generate the corresponding first current I1 and second current I2.

Figure 10:
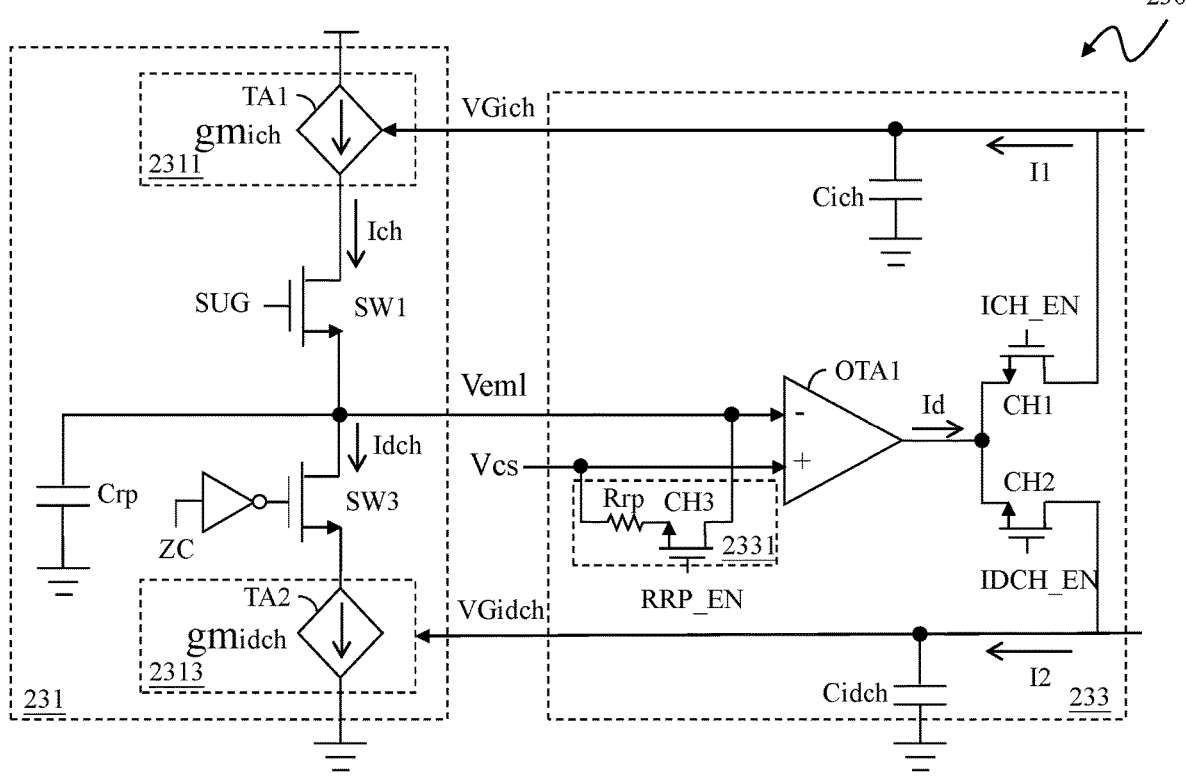
FIG. 10 shows a schematic diagram of a ninth embodiment of the present invention.

Please refer to FIG. 10, which shows a schematic diagram of a ninth embodiment of the present invention. FIG. 10 shows a schematic diagram of an inductor current emulator circuit (i.e., inductor current emulator circuit 230) according to a specific embodiment of the present invention. As shown in FIG. 10, the emulator control circuit 230 comprises: a ramp signal generation circuit 231 and an emulator control circuit 233. The ramp signal generation circuit 231 is configured to operably generate the ramp signal Veml according to the first signal VGich and the second signal VGidch, to emulate the inductor current IL flowing through the inductor L of the power stage circuit 210. As compared to the seventh embodiment shown in FIG. 8, in this embodiment, the ramp signal generation circuit 231 further includes a zero current switch SW3. The zero current switch SW3 is coupled between the second conversion circuit 2313 and the ramp capacitor Crp. The zero current switch SW3 is configured to operably determine whether the second ramp current Idch discharges the ramp capacitor Crp according to a zero current signal ZC. When the zero current signal ZC indicates that the inductor current IL is zero, the ramp signal generation circuit 231 controls the second ramp current Idch to cease discharging the ramp capacitor Crp, so that the inductor current IL is emulated to be zero. The above-mentioned control mechanism is particularly suitable for use in a situation where the switching regulator 200 operates in a discontinuous-conduction mode (DCM).

In a switching regulator, generally, the zero current signal ZC is switched to a high level when the inductor current IL is zero. Accordingly, as shown in FIG. 10, the zero current signal ZC is inputted into an NOT gate, so that the zero current switch SW3 is controlled to be ON under a situation where the inductor current IL is not zero, whereby the second ramp current Idch discharges the ramp capacitor Crp. On the other hand, under a situation where the inductor current IL is zero, the zero current switch SW3 is controlled to be OFF, whereby the second ramp current Idch stops discharging the ramp capacitor Crp.

Figure 11:
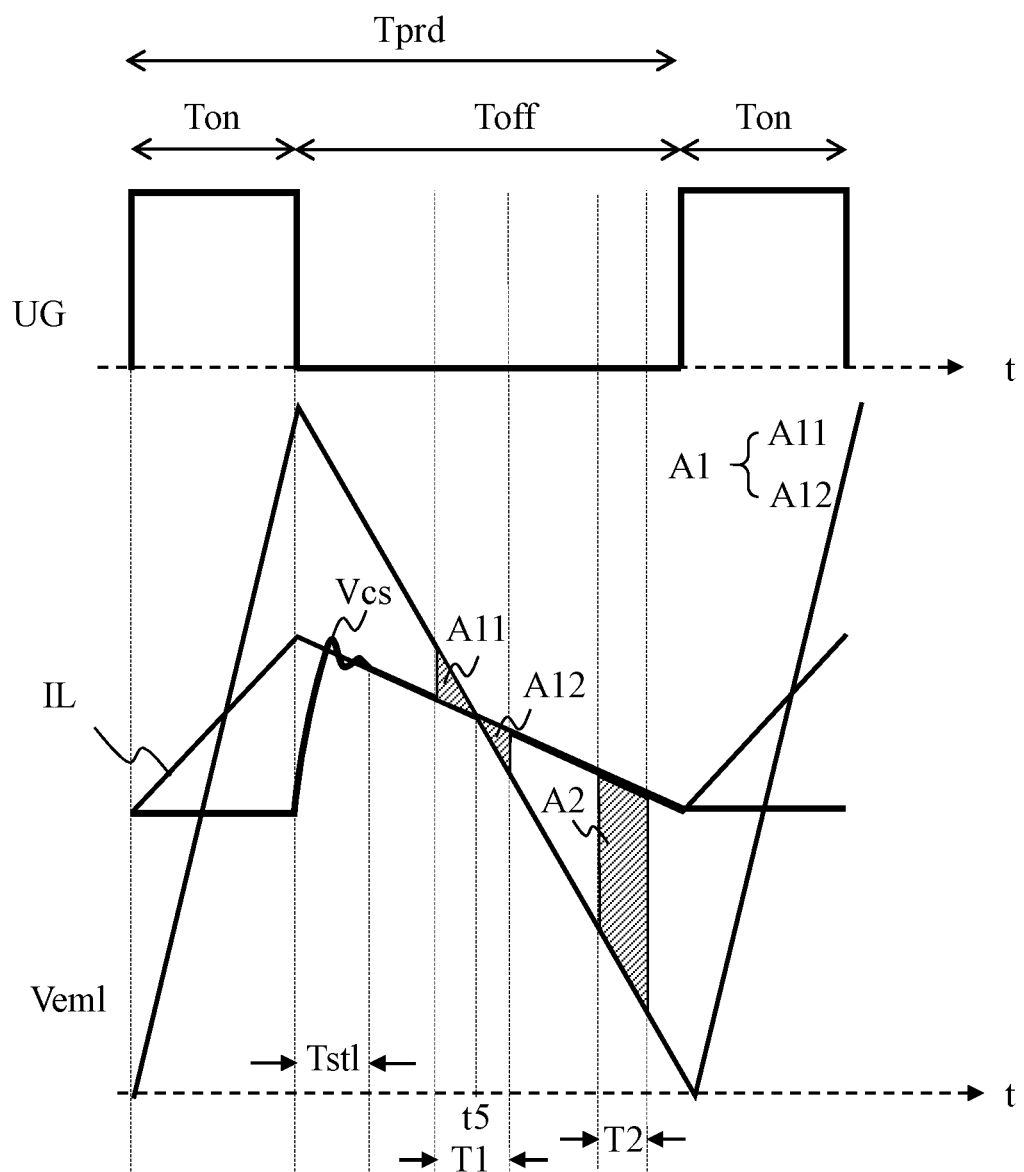
FIG. 11 illustrates a waveform diagram depicting the operation of an embodiment of an inductor current emulator circuit according to the present invention.

Please refer to FIG. 11, which illustrates a waveform diagram depicting the operation of an embodiment of an inductor current emulator circuit. Similar to FIG. 2C, the emulator control circuit 233 performs first integration on differences between the current sense signal Vcs and the ramp signal Veml during the first duration T1 shown in FIG. 11 (in this example, the first integration includes the shaded area A11 and the shaded area A12 in FIG. 11), to generate the first signal VGich. The emulator control circuit 233 performs second integration on differences between the current sense signal Vcs and the ramp signal Veml during a second duration T2 shown in FIG. 11 (as shown by the shaded area A2 in FIG. 11), to generate the second signal VGidch.

It is noteworthy that, in the waveform diagram shown in FIG. 11, if the current sense signal Vcs intersects with the ramp signal Veml at a center time point (as shown by the timing point t5 in FIG. 11) of the first duration T1, the shaded area A1 will be zero because the shaded area A11 and the shaded area A12 cancel with each other. Under such situation, it is required to regulate the second integration result (as shown by the shaded area A2 in FIG. 11) to zero. FIG. 11 is meant to illustrate that, according to the present invention, it is required to regulate not only the first difference integration value (i.e., the first integration result) to zero, but also the second difference integration value (i.e., the second integration result) to zero, to avoid an undesirable situation as shown in FIG. 11 which can cause a huge deviation between the ramp signal Veml and the inductor current IL.

Figure 12A:
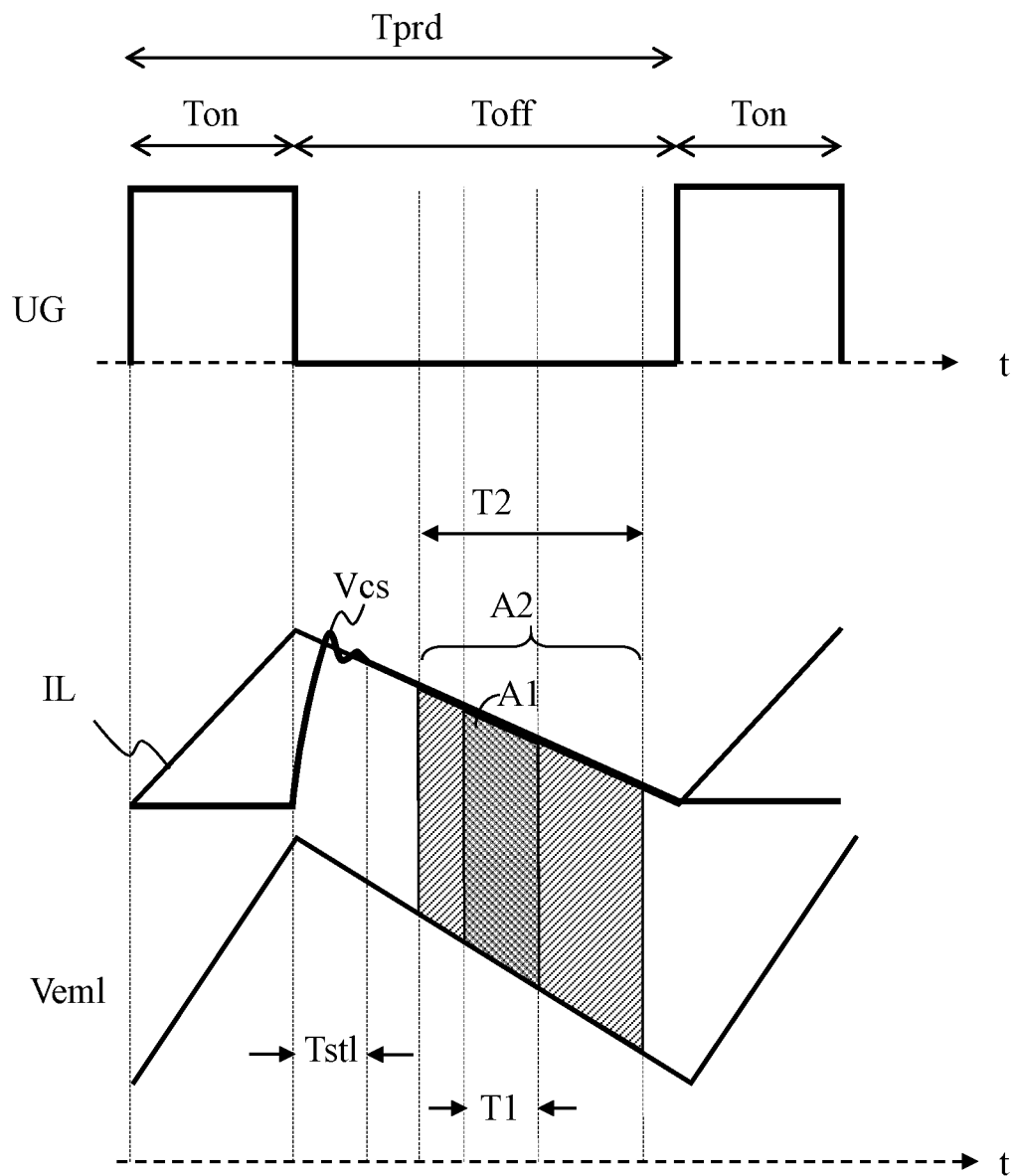
FIG. 12A and FIG. 12B illustrate two waveform diagrams depicting the operation of two embodiments of an inductor current emulator circuit according to the present invention, respectively.

Please refer to FIG. 12A, which illustrates a waveform diagram depicting the operation of an embodiment of an inductor current emulator circuit. Similar to FIG. 2C and FIG. 11, the emulator control circuit 233 performs first integration on differences between the current sense signal Vcs and the ramp signal Veml during the first duration T1 shown in FIG. 12A, to obtain a first difference integration value of the differences between the current sense signal Vcs and the ramp signal Veml (as shown by the shaded area A1 in FIG. 12A), so as to generate the first signal VGich. The emulator control circuit 233 performs second integration on differences between the current sense signal Vcs and the ramp signal Veml during a second duration T2 shown in FIG. 12A, to obtain a second difference integration value of the differences between the current sense signal Vcs and the ramp signal Veml (as shown by the shaded area A2 in FIG. 12A) of the second integration, so as to generate the second signal VGidch.

It is noteworthy that, in the waveform diagram shown in FIG. 12A, the first duration T1 overlaps with the second duration T2 (e.g., as shown in FIG. 12A, the first duration T1 is a part of the second duration T2); in this case, it is preferred that two different operational trans-impedance amplifiers OTA1 and OTA2 (as the embodiment shown in FIG. 9) are used to perform integrations on the differences between the current sense signal Vcs and the ramp signal Veml via.

Figure 12B:
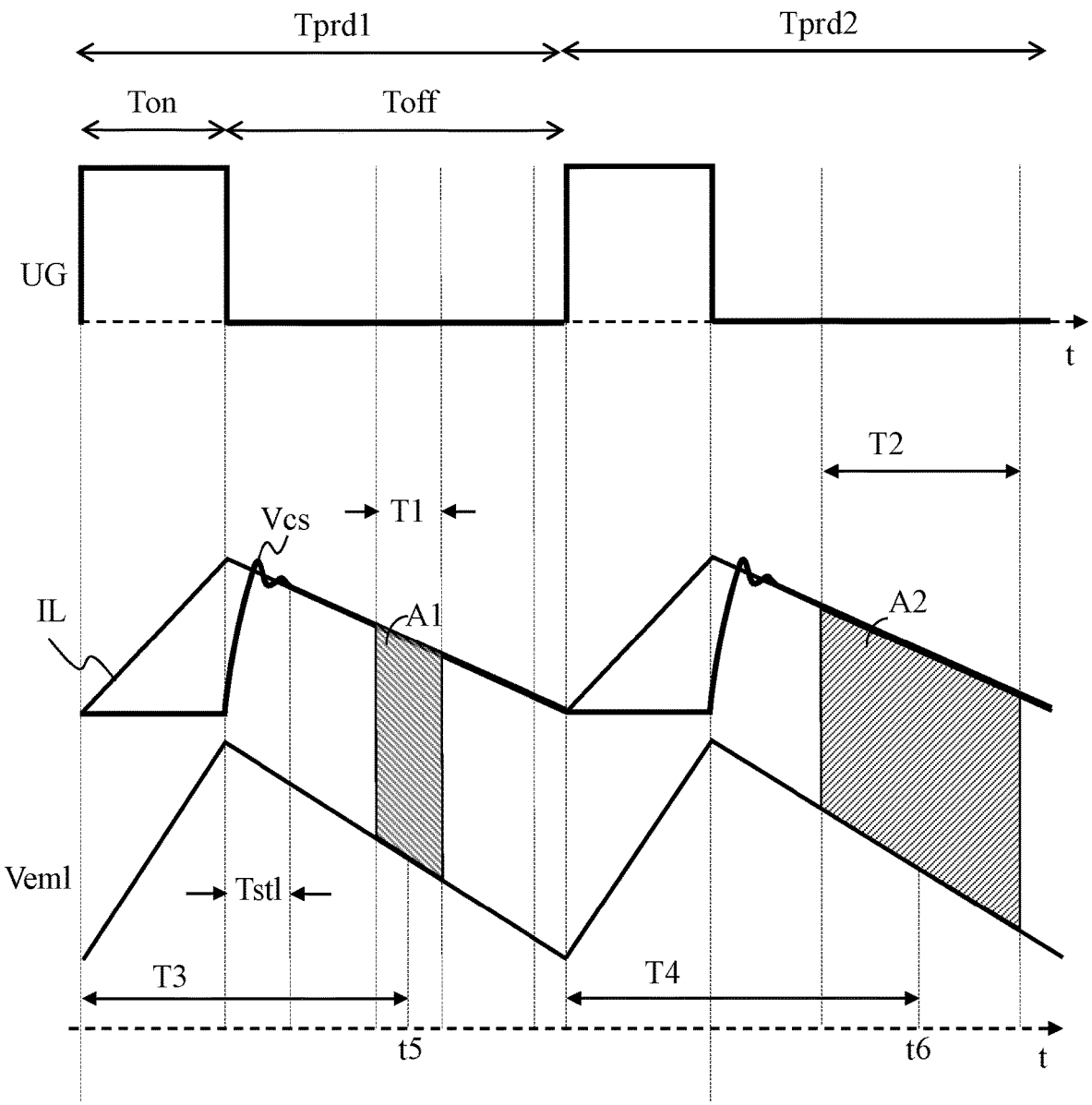
Figure 13A:
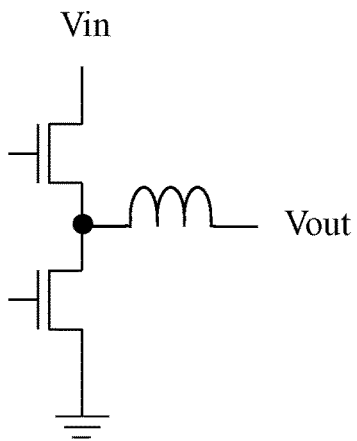
FIGS. 13A-13J show synchronous and asynchronous buck, boost, inverting, buck-boost and inverting-boost power stage circuits, respectively.
Figure 13B:
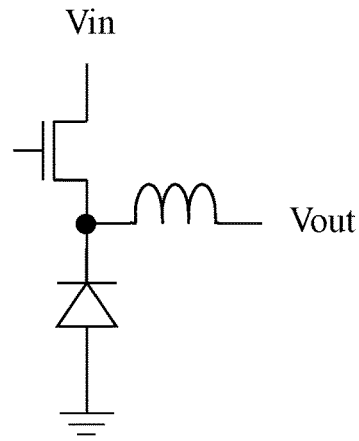
Figure 13C:
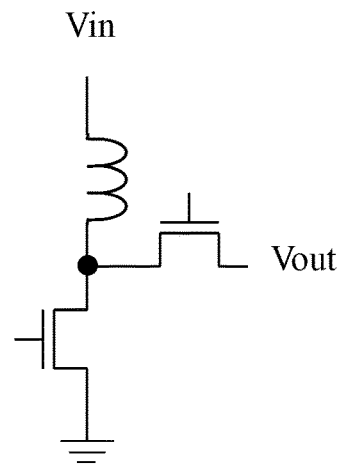
Figure 13D:
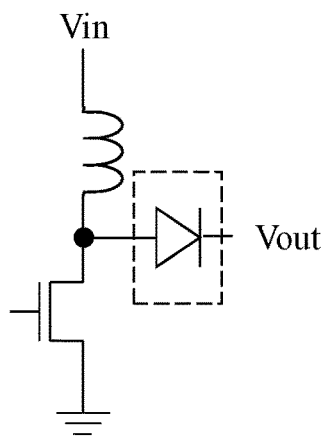
Figure 13E:
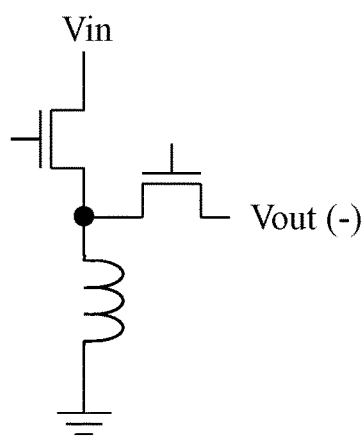
Figure 13F:
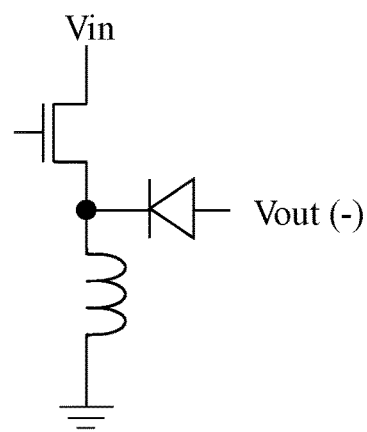
Figure 13G:
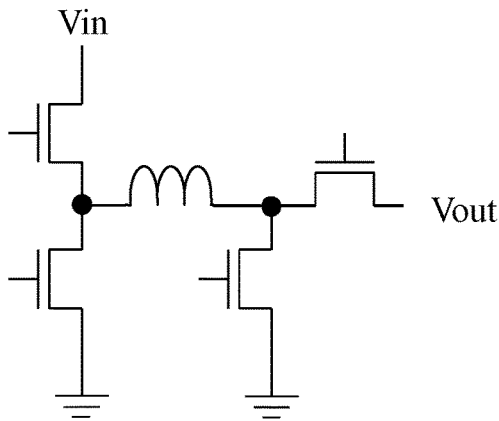
Figure 13H:
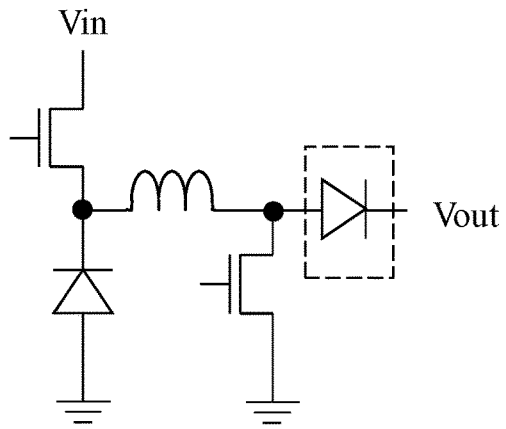
Figure 13I:
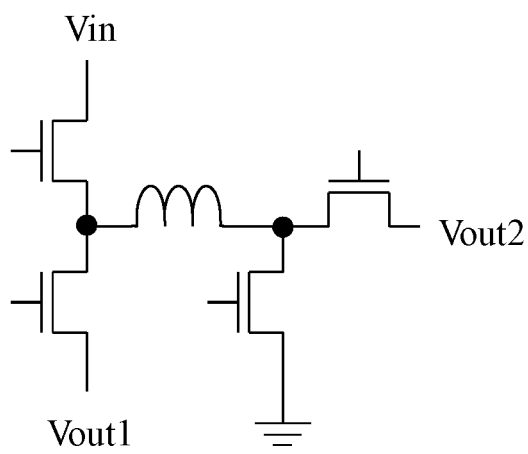
Figure 13J:
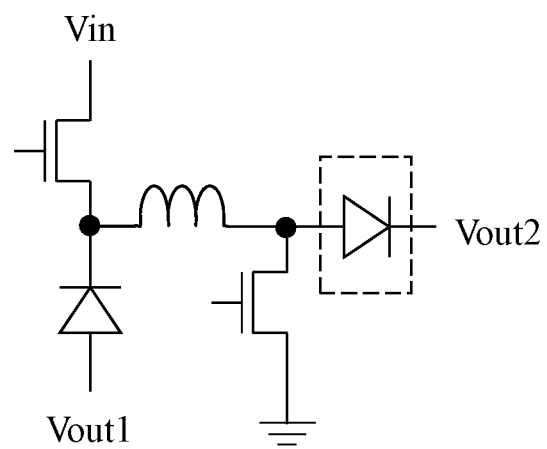

Please refer to FIG. 12B, which illustrates a waveform diagram depicting the operation of an embodiment of an inductor current emulator circuit. Similar to FIG. 12A, the emulator control circuit 233 performs first integration on differences between the current sense signal Vcs and the ramp signal Veml during the first duration T1 shown in FIG. 12B, to obtain a first difference integration value of the differences between the current sense signal Vcs and the ramp signal Veml (as shown by the shaded area A1 in FIG. 12B), so as to generate the first signal VGich. The emulator control circuit 233 performs second integration on differences between the current sense signal Vcs and the ramp signal Veml during a second duration T2 shown in FIG. 12B, to obtain a second difference integration value of the differences between the current sense signal Vcs and the ramp signal Veml (as shown by the shaded area A2 in FIG. 12B) of the second integration, so as to generate the second signal VGidch.

It is noteworthy that, in the waveform diagram shown in FIG. 12B, the first duration T1 and second duration T2 are within different cycle periods. For example, the first duration T1 which is within the cycle period Tprd1 and the second duration T2 which is within the cycle period Tprd2 can be arranged in an alternating manner. Under such situation, the emulator control circuit 233 can compare the current sense signal Vcs with the ramp signal Veml to obtain differences between the current sense signal Vcs and the ramp signal Veml in different cycle periods, i.e., the emulator control circuit 233 can obtain a first difference integration value of the differences between the current sense signal Vcs and the ramp signal Veml and a second difference integration value of the differences between the current sense signal Vcs and the ramp signal Veml during the first duration T1 and the second duration T2 which are within different cycle periods (Tprd1 and Tprd2), respectively, and generate the first current I1 and the second current I2 respectively in corresponding cycle periods. It is noteworthy that, in this embodiment, the center time point (timing point t5 in FIG. 12B) of the first duration T1 which is within the cycle period Tprd1 and the center time point (timing point t6 in FIG. 12B) of the second duration T2 should not be the same timing, i.e., the length of the duration T3 is not equal to the length of the duration T4.

It is noteworthy that, because the control mechanism of the inductor current emulator circuit of the present invention performs is based on obtaining areas (i.e., difference integration values) between the current sense signal Vcs and the ramp signal Veml during different durations, the present invention has many merits: first, the calculation of the areas because the present invention performs integration on differences (i.e., difference integration values) between the current sense signal Vcs and the ramp signal Veml can be implemented by simple circuitry with lower manufacturing cost. Second, feedback control based on the above-mentioned area calculation is more accurate and more error-tolerable.

The present invention has been described in considerable detail with reference to certain preferred embodiments thereof. It should be understood that the description is for illustrative purpose, not for limiting the scope of the present invention. An embodiment or a claim of the present invention does not need to achieve all the objectives or advantages of the present invention. The title and abstract are provided for assisting searches but not for limiting the scope of the present invention. Those skilled in this art can readily conceive variations and modifications within the spirit of the present invention. For example, to perform an action "according to" a certain signal as described in the context of the present invention is not limited to performing an action strictly according to the signal itself, but can be performing an action according to a converted form or a scaled-up or down form of the signal, i.e., the signal can be processed by a voltage-to-current conversion, a current-to-voltage conversion, and/or a ratio conversion, etc. before an action is performed. It is not limited for each of the embodiments described hereinbefore to be used alone; under the spirit of the present invention, two or more of the embodiments described hereinbefore can be used in combination. For example, two or more of the embodiments can be used together, or, a part of one embodiment can be used to replace a corresponding part of another embodiment. In view of the foregoing, the spirit of the present invention should cover all such and other modifications and variations, which should be interpreted to fall within the scope of the following claims and their equivalents.

What is claimed is:

1. An inductor current emulator circuit for use in a switching regulator, the switching regulator being configured to operably control a high side switch and/or a low side switch of a power stage circuit of the switching regulator, so as to convert an input voltage to an output voltage, wherein the inductor current emulator circuit is configured to operably generate a ramp signal for emulating an inductor current flowing through an inductor of the power stage circuit; the inductor current emulator circuit comprising:
   a ramp signal generation circuit, which is configured to operably generate the ramp signal according to a first signal and a second signal; and
   an emulator control circuit coupled to the power stage circuit and the ramp signal generation circuit, wherein the emulator control circuit is configured to operably generate the first signal and the second signal according to a current sense signal and the ramp signal;
   wherein the current sense signal is related to a high side switch current flowing through the high side switch or a low side switch current flowing through the low side switch;
   wherein the emulator control circuit obtains a first difference integration value of differences between the current sense signal and the ramp signal during a first duration, to generate the first signal;
   wherein the emulator control circuit obtains a second difference integration value of differences between the current sense signal and the ramp signal during a second duration, to generate the second signal;
   wherein a center time point of the first duration is different from a center time point of the second duration.

2. The inductor current emulator circuit of claim 1, wherein the first duration and the second duration are two

19 different durations after a settle time from when one of the high side switch and the low side switch is in ON operation.

3. The inductor current emulator circuit of claim 1, wherein the first signal and the second signal are configured to operably determine at least two of the group consisting of a rising slope, a falling slope, a peak, a valley and a peak-to-valley value of the ramp signal.

4. The inductor current emulator circuit of claim 1, wherein a value of the ramp signal is regulated to a value of the inductor current multiplied by a predetermined real number, and further plus a predetermined compensation value.

5. The inductor current emulator circuit of claim 4, wherein the value of the ramp signal is not smaller than zero.

6. The inductor current emulator circuit of claim 1, wherein the emulator control circuit is configured to operably generate the first signal and the second signal to control the ramp signal generation circuit, thereby regulating both of the first difference integration value and the second difference integration value to zero.

7. The inductor current emulator circuit of claim 1, wherein the emulator control circuit includes an amplifier circuit, which is configured to operably compare the current sense signal with the ramp signal, to generate the differences between the current sense signal and the ramp signal.

8. The inductor current emulator circuit of claim 7, wherein the emulator control circuit further includes a feedforward circuit, which is coupled between two input terminals of the amplifier circuit, wherein the feedforward circuit is configured to operably feedforward the current sense signal and the ramp signal, so as to expedite regulation of the ramp signal.

9. The inductor current emulator circuit of claim 7, wherein the emulator control circuit includes:
an operational trans-impedance amplifier (OTA), wherein the same single OTA is configured to operably compare the current sense signal with the ramp signal during the first duration and the second duration, respectively, wherein the first duration and the second duration are within different cycle periods, and respectively generate a corresponding first current during the first duration and a corresponding second current during the second duration according to differences between the current sense signal and the ramp signal;
a first capacitor configured to be operably charged by the first current to generate the first signal; and
a second capacitor configured to be operably charged by the second current to generate the second signal.

10. The inductor current emulator circuit of claim 1, wherein the emulator control circuit includes:
an operational trans-impedance amplifier (OTA), wherein the same single OTA is configured to operably compare the current sense signal with the ramp signal during the first duration and the second duration, and respectively generate a corresponding first current during the first duration and a corresponding second current during the second duration according to the differences between the current sense signal and the ramp signal;
a first capacitor configured to be operably charged by the first current to generate the first signal; and
a second capacitor configured to be operably charged by the second current to generate the second signal.

11. The inductor current emulator circuit of claim 1, wherein the emulator control circuit includes:
a first operational trans-impedance amplifier (OTA), wherein the first OTA is configured to operably compare the current sense signal with the ramp signal

20 during the first duration, and generate a corresponding first current during the first duration according to a difference between the current sense signal and the ramp signal;
a second OTA, which is an OTA different from the first OTA, wherein the second OTA is configured to operably compare the current sense signal with the ramp signal during the second duration, and generate a corresponding second current during the second duration according to the difference between the current sense signal and the ramp signal;
a first capacitor configured to be operably charged by the first current to generate the first signal; and
a second capacitor configured to be operably charged by the second current to generate the second signal.

12. The inductor current emulator circuit of claim 1, wherein the ramp signal generation circuit includes:
a first conversion circuit coupled to the emulator control circuit, wherein the first conversion circuit is configured to operably generate a first ramp current according to the first signal;
a second conversion circuit coupled to the emulator control circuit, wherein the second conversion circuit is configured to operably generate a second ramp current according to the second signal;
a ramp capacitor, which is coupled to the first conversion circuit and the second conversion circuit, wherein the ramp capacitor is configured to be operably charged and discharged through the first ramp current and the second ramp current, to generate the ramp signal; and
a first ramp switch coupled between the first conversion circuit and the ramp capacitor, wherein the first ramp switch is configured to operably switch to determine whether the first ramp current charges the ramp capacitor, wherein a switching time of the first ramp switch is synchronous with a switching time of the high side switch or the low side switch.

13. The inductor current emulator circuit of claim 12, wherein the ramp signal generation circuit further includes:
a second ramp switch coupled between the second conversion circuit and the ramp capacitor, wherein the second ramp switch is configured to operably switch to determine whether the second ramp current discharges the ramp capacitor, wherein a switching time of the second ramp switch is synchronous with a switching time of the other of the high side switch and the low side switch.

14. The inductor current emulator circuit of claim 12, wherein under a situation where the inductor current is zero, the ramp signal generation circuit is configured to operably control the first ramp current and/or the second ramp current further according to a zero current signal, so as to correspondingly cease charging and/or discharging the ramp capacitor, so that the inductor current is emulated to be zero.

15. The inductor current emulator circuit of claim 14, wherein the ramp signal generation circuit further includes:
a zero current switch coupled between the second conversion circuit and the ramp capacitor, wherein the zero current switch is configured to operably determine whether the second ramp current discharges the ramp capacitor according to the zero current signal.

16. An inductor current emulation method for use in a switching regulator, the switching regulator being configured to operably control a high side switch and/or a low side switch of a power stage circuit of the switching regulator, so as to convert an input voltage to an output voltage, wherein the inductor current emulation method is configured to operably generate a ramp signal for emulating an inductor current flowing through an inductor of the power stage circuit; the inductor current emulation method comprising:

selecting and sensing a high side switch current flowing through the high side switch or a low side switch current flowing through the low side switch, so as to generate a current sense signal;

obtaining a first difference integration value of differences between the current sense signal and a ramp signal during a first duration, to generate a first signal;

obtaining a second difference integration value of differences between the current sense signal and the ramp signal during a second duration, to generate a second signal; and generating the ramp signal according to the first signal and the second signal;

wherein a center time point of the first duration is different from a center time point of the second duration.

17. The inductor current emulation method of claim 16, wherein the first duration and the second duration are two different durations after a settle time from when one of the high side switch and the low side switch is in ON operation.

18. The inductor current emulation method of claim 16, wherein the first signal and the second signal are configured to operably determine at least two of the group consisting of a rising slope, a falling slope, a peak, a valley and a peak-to-valley value of the ramp signal.

19. The inductor current emulation method of claim 16, wherein a value of the ramp signal is regulated to a value of the inductor current multiplied by a predetermined real number, and further plus a predetermined compensation value.

20. The inductor current emulation method of claim 19, wherein the value of the ramp signal is not smaller than zero.

21. The inductor current emulation method of claim 16, wherein the first signal and the second signal are configured to operably adjust the ramp signal, thereby regulating both of the first difference integration value and the second difference integration value to zero.

22. The inductor current emulation method of claim 16, further comprising:

comparing the current sense signal with the ramp signal, to generate the differences between the current sense signal and the ramp signal.

23. The inductor current emulation method of claim 22, wherein the step of comparing the current sense signal with the ramp signal, to generate the differences between the current sense signal and the ramp signal further includes:

feedforwarding the current sense signal and the ramp signal, so as to expedite regulation of the ramp signal.

24. The inductor current emulation method of claim 22, further comprising:

comparing the current sense signal with the ramp signal during the first duration and the second duration via a same single operational trans-impedance amplifier (OTA), and generating a corresponding first current during the first duration and a corresponding second current during the second duration according to the differences between the current sense signal and the ramp signal;

charging a first capacitor via the first current, so as to generate the first signal; and charging a second capacitor via the second current, so as to generate the second signal.

25. The inductor current emulation method of claim 22, further comprising:

comparing the current sense signal with the ramp signal during the first duration via a first operational trans-impedance amplifier (OTA), and generating a corresponding first current during the first duration according to the difference between the current sense signal and the ramp signal;

comparing the current sense signal with the ramp signal during the second duration via a second OTA which is an OTA different from the first OTA, and generating a corresponding second current during the second duration via the second OTA according to the difference between the current sense signal and the ramp signal;

charging a first capacitor via the first current, so as to generate the first signal; and charging a second capacitor via the second current, so as to generate the second signal.

26. The inductor current emulation method of claim 22, further comprising:

comparing the current sense signal with the ramp signal during the first duration and the second duration via a same single operational trans-impedance amplifier (OTA), wherein the first duration and the second duration are within different cycle periods from each other, and generating a corresponding first current during the first duration and a corresponding second current during the second duration according to the differences between the current sense signal and the ramp signal;

charging a first capacitor via the first current, so as to generate the first signal; and charging a second capacitor via the second current, so as to generate the second signal.

27. The inductor current emulation method of claim 16, further comprising:

generating a first ramp current according to the first signal;

generating a second ramp current according to the second signal;

charging and discharging a ramp capacitor by the first ramp current and the second ramp current, respectively; and switching a first ramp switch, to determine whether the first ramp current charges the ramp capacitor, wherein a switching time of the first ramp switch is synchronous with a switching time of one of the high side switch and the low side switch.

28. The inductor current emulation method of claim 27, further comprising:

switching a second ramp switch, to determine whether the second ramp current discharges the ramp capacitor, wherein a switching time of the second ramp switch is synchronous with a switching time of the other of the high side switch and the low side switch.

29. The inductor current emulation method of claim 27, further comprising:

under a situation where the inductor current is zero, controlling the first ramp current and/or the second ramp current according to a zero current signal, so as to correspondingly cease charging and/or discharging the ramp capacitor, so that the inductor current is emulated to be zero.

30. The inductor current emulation method of claim 29, further comprising:

determining whether the second ramp current discharges the ramp capacitor according to the zero current signal.

* * * * *